United States Patent
Krah

(10) Patent No.: US 7,986,193 B2
(45) Date of Patent: Jul. 26, 2011

(54) NOISE REDUCTION WITHIN AN ELECTRONIC DEVICE USING AUTOMATIC FREQUENCY MODULATION

(75) Inventor: Christoph Horst Krah, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 123 days.

(21) Appl. No.: 11/650,045

(22) Filed: Jan. 3, 2007

(65) Prior Publication Data

US 2008/0157893 A1  Jul. 3, 2008

(51) Int. Cl.
G06F 3/041 (2006.01)
G01R 23/06 (2006.01)

(52) U.S. Cl. .................. 331/44; 331/4; 331/17; 345/174

(58) Field of Classification Search .................. 331/4, 44; 345/173, 174
See application file for complete search history.

(56) References Cited

U.S. PATENT DOCUMENTS

| | | |
|---|---|---|
| 4,278,947 A | 7/1981 | Nicollian et al. |
| 5,120,907 A | 6/1992 | Shinbori et al. |
| 5,374,787 A | 12/1994 | Miller et al. |
| 5,483,261 A | 1/1996 | Yasutake |
| 5,488,204 A | 1/1996 | Mead et al. |
| 5,568,098 A | 10/1996 | Horie et al. |
| 5,638,093 A | 6/1997 | Takahashi et al. |
| 5,730,165 A | 3/1998 | Philipp |
| 5,790,107 A | 8/1998 | Kasser et al. |
| 5,825,352 A | 10/1998 | Bisset et al. |
| 5,831,600 A | 11/1998 | Inoue et al. |
| 5,835,079 A | 11/1998 | Shieh |
| 5,880,411 A | 3/1999 | Gillespie et al. |
| 6,031,883 A * | 2/2000 | Sanderford et al. .......... 375/344 |
| 6,180,894 B1 | 1/2001 | Chao et al. |
| 6,188,391 B1 | 2/2001 | Seely et al. |
| 6,310,610 B1 | 10/2001 | Beaton et al. |
| 6,323,846 B1 | 11/2001 | Westerman et al. |
| 6,583,676 B2 | 6/2003 | Krah et al. |
| 6,630,929 B1 | 10/2003 | Adler et al. |
| 6,690,387 B2 | 2/2004 | Zimmerman et al. |
| 6,998,922 B2 | 2/2006 | Jensen et al. |

(Continued)

FOREIGN PATENT DOCUMENTS

JP  2000-163031 A  6/2000

(Continued)

OTHER PUBLICATIONS

International Search Report mailed Jul. 21, 2008, for PCT Application No. PCT/US2007/026188, filed Dec. 21, 2007, two pages.

(Continued)

*Primary Examiner* — Robert Pascal
*Assistant Examiner* — James E Goodley
(74) *Attorney, Agent, or Firm* — Morrison & Foerster LLP

(57) ABSTRACT

Disclosed is a system and method for providing an oscillating signal of relatively precise frequency without using a signal provided by a crystal as a reference. Disclosed is a feedback oscillator circuit configured to output an oscillating signal having a frequency defined by a reference signal. The oscillating signal can be sent to one or more circuits including at least one frequency sensitive element. The frequency sensitive element produces an output signal which depends on the frequency of the oscillating signal. A controller controls the reference signal in order to cause an attribute of the output signal to have a value within a desired range.

48 Claims, 16 Drawing Sheets

U.S. PATENT DOCUMENTS

| | | |
|---|---|---|
| 7,015,894 B2 | 3/2006 | Morohoshi |
| 7,019,598 B2 | 3/2006 | Duncan et al. |
| 7,031,886 B1 | 4/2006 | Hargreaves |
| 7,046,097 B2 | 5/2006 | Kappes et al. |
| 7,095,992 B2 | 8/2006 | Kim et al. |
| 7,098,747 B2 | 8/2006 | Anand |
| 7,099,643 B2 | 8/2006 | Lin |
| 7,120,412 B2 | 10/2006 | Anand |
| 7,184,064 B2 | 2/2007 | Zimmerman et al. |
| 7,356,111 B1 | 4/2008 | Dean |
| 7,663,607 B2 | 2/2010 | Hotelling et al. |
| 2003/0025566 A1 | 2/2003 | Rogers |
| 2003/0164820 A1 | 9/2003 | Kent |
| 2006/0026521 A1 | 2/2006 | Hotelling et al. |
| 2006/0063502 A1 | 3/2006 | Shibuya et al. |
| 2006/0097991 A1 | 5/2006 | Hotelling et al. |
| 2006/0197750 A1 | 9/2006 | Kerr |
| 2006/0197753 A1 | 9/2006 | Hotelling |
| 2006/0214921 A1* | 9/2006 | Takahashi et al. ............ 345/173 |
| 2008/0068091 A1 | 3/2008 | Kwan et al. |
| 2008/0157882 A1 | 7/2008 | Krah |

FOREIGN PATENT DOCUMENTS

| | | | |
|---|---|---|---|
| JP | 2002-342033 A | 11/2002 |
| WO | WO-02/065055 A2 | 8/2002 |
| WO | WO-02/065055 A3 | 8/2002 |
| WO | WO-2008/085420 A2 | 7/2008 |
| WO | WO-2008/085420 A3 | 7/2008 |
| WO | WO-2008/085456 A2 | 7/2008 |

OTHER PUBLICATIONS

International Search Report mailed May 8, 2009, for PCT Application No. PCT/US2007/026297, filed Dec. 21, 2007, five pages.

Non-Final Office Action mailed Dec. 29, 2008, for U.S. Appl. No. 11/649,966, filed Jan. 3, 2007, 15 pages.

Non-Final Office Action mailed Jun. 18, 2009, for U.S. Appl. No. 11/649,966, filed Jan. 3, 2007, 16 pages.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

Reference current generator

NOISE REDUCTION WITHIN AN ELECTRONIC DEVICE USING AUTOMATIC FREQUENCY MODULATION

FIELD OF THE INVENTION

This invention relates to tuned oscillation circuits for electronic devices, and more particularly to providing a precise oscillating signal without using a crystal as a reference.

BACKGROUND OF THE INVENTION

Oscillating signals are widely used in electronics. Examples of their use include providing clock signals, or providing carrier signals which can later be modified to include information. For example, an oscillating signal can be used to drive a row in a capacitive touch sensor panel. Changes to the sensed signal indicate a touch event at the panel.

There are various known ways to create an oscillating signal. For example, persons of skill in the art would recognize that a simple circuit including an inductor and a capacitor would create such a signal. However, most circuit based oscillators suffer from the fact that they do not provide a signal with a precise and predictable frequency and phase.

Therefore, many electronic devices use crystals to provide an oscillating signal. Crystals are known to provide signals of more precise frequencies. Since it may desirable to generate a wide range of frequencies in a higher frequency band, the crystal may serve as a frequency reference for a frequency multiplier whose output provides a stable frequency which accurately tracks the crystal frequency and can be a multiple of the crystal frequency, the same or lower frequency Such circuit is referred to as a Phase Locked Loop, or PLL. Using a PLL to generate higher frequencies has the benefit of generating accurate and higher frequencies from a crystal based reference clock that's much lower in frequency, potentially easing the requirement on the type of crystal used and lowering power consumption (usually crystals are not offered beyond 100 Mhz and usually, the power consumption of the crystal oscillator scales it's frequency. Therefore, it is desirable to keep the crystal oscillator frequency as low as possible.)

However, the use of crystals adds significant costs to the system not only because of the crystal itself but also because of associated support circuitry and PCB space., which is usually very limited in some devices such as, for example, small hand held products.

SUMMARY OF THE INVENTION

An oscillating signal of relatively precise frequency is generated without using a signal provided by a crystal as a reference. A feedback oscillator circuit is configured to output an oscillating signal having a frequency defined by a reference signal. The oscillating signal can be sent to one or more circuits including at least one frequency sensitive element. The frequency sensitive element can produce an output signal which depends on the frequency of the oscillating signal. A controller controls the reference signal in order to cause an attribute of the output signal to have a value within a desired range.

The feedback oscillator circuit can include a voltage or current controlled oscillator. The circuit can include an input which receives a signal having reference voltage or current. The feedback circuit can be configured to output an oscillating signal having a frequency defined by the reference voltage or current. The oscillating signal can be sent to one or more circuits including at least one frequency sensitive element.

The system can also include a reference generator which generates the reference voltage or current and a controller which controls the reference generator to cause it to generate a reference voltage or current of a specific magnitude.

The operation of the frequency sensitive element can depend on the frequency of the oscillating signal. The controller can receive a control input signal from the frequency sensitive element. The control input signal can indicate the operation of the frequency sensitive element and can thus be dependent on the frequency of the oscillating signal.

The controller can modify the frequency of the oscillating signal by causing the reference generator to output reference signals of varying magnitude. While modifying the frequency, the controller can monitor the control input and note at which frequencies the frequency sensitive element operates as desired. The controller can then find a desired frequency in which the frequency sensitive element operates as desired and controls the reference generator in order to keep the oscillating signal at the desired frequency.

In additional embodiments, the controller can perform additional scanning and mathematical operations in order to find an optimal frequency. Furthermore, the controller can monitor the control input signal continuously and if, for any reason, the frequency sensitive element stops operating in a desired manner, modify the frequency as necessary.

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention can be practiced. It is to be understood that other embodiments can be used and structural changes can be made without departing from the scope of the preferred embodiments of the present invention.

Although embodiments of the present invention may be described herein in the context of a touch sensitive panel, it should be understood that the present invention is not limited to touch sensitive panels, but is generally applicable to other electronic circuits requiring a precise oscillating signal.

An oscillating signal which does not rely on a crystal to provide a reference signal is disclosed. Instead, circuit based elements can be used to generate an oscillating signal, while a controller can monitor the effect the oscillating signal is having on one or more frequency sensitive elements and modify the frequency of the oscillating signal to ensure optimal or acceptable performance. Thus, embodiments of the present invention replace the precision traditionally provided by a crystal by monitoring and intelligent control provided by the controller.

Figure 1:
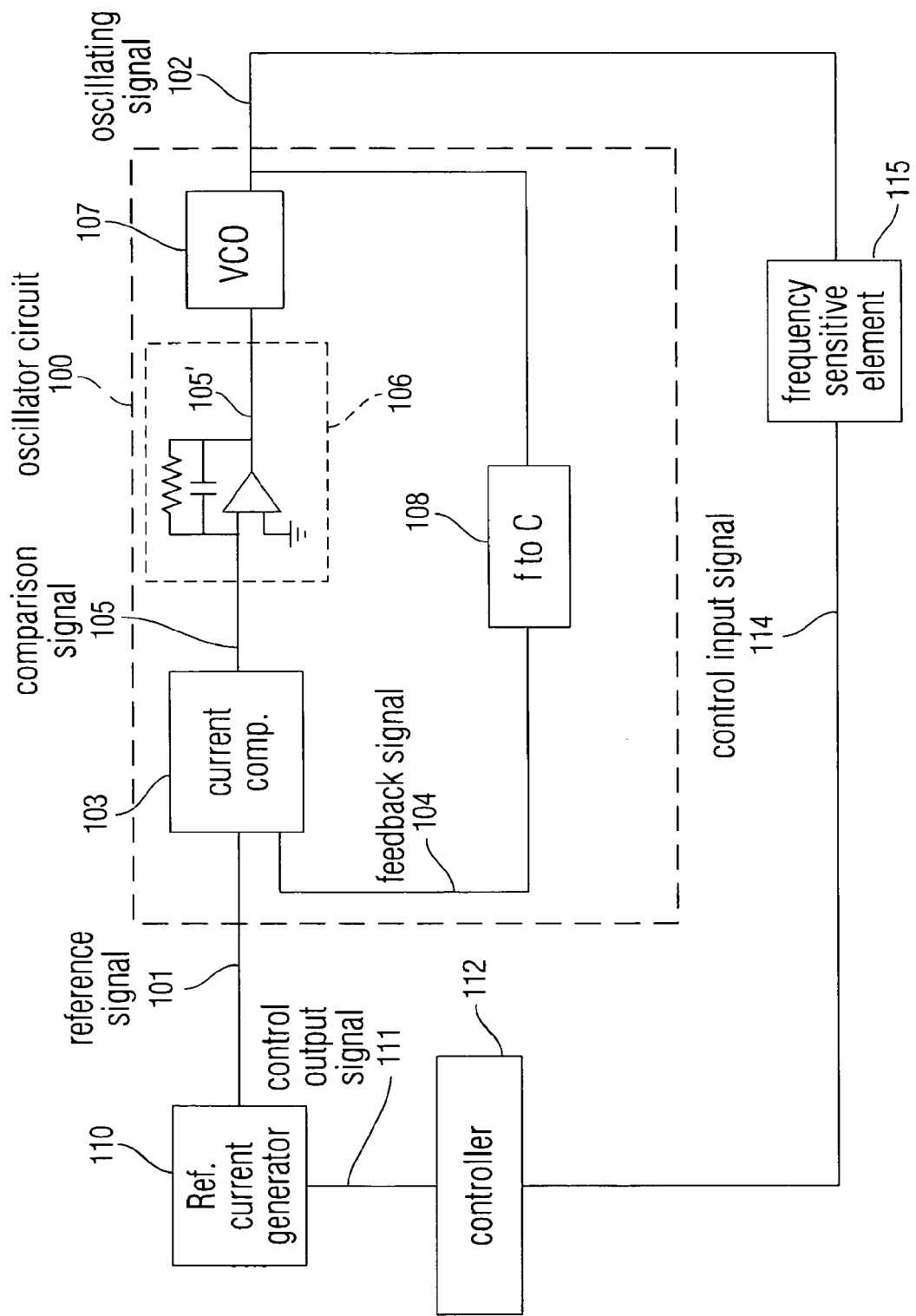
FIG. 1 is an overall diagram of one embodiment of this invention.

FIG. 1 is an overall diagram of an embodiment of the present invention. For ease of understanding, some signals are indicated by numerals placed on the wires upon which these signals travel.

Feedback oscillator circuit 100 can be used to create oscillating signal 102, which is based on the magnitude of the current of reference signal 101. Circuit 100 can include current comparator 103 which compares the current of incoming reference signal 101 with feedback signal 104. The current comparator outputs comparison signal 105, whose voltage is based on the difference of the currents of signals 101 and 104.

Loop filter 106 may be used to integrate signal 105 and generate signal 105'. The loop-filter 105 can be designed to provide a certain frequency response. The frequency response may be optimized to allow fast and stable locking onto the reference. The loop filter may be an active or passive low pass filter.

Voltage controlled oscillator 107 can generate oscillating signal 102. The frequency of the oscillating signal can be controlled by the voltage of the filtered comparison signal 105'. The oscillating signal can be sent through a feedback loop into frequency-to-current converter 108. Frequency-to-current converter 108 can convert the incoming oscillating signal 102 into feedback signal 104 whose current is reflective of the frequency of oscillating signal 102. Thus, the feedback oscillator circuit can ensure that the frequency of oscillating signal 102 is at a specific value associated with the magnitude of reference current 101.

Reference current generator 110 generates the reference current. The magnitude of the generated reference current can be based on control output signal 111 generated by controller 112. In the preferred embodiment, the controller can comprise a digital circuit and control output signal 111 can comprise one or more digital signals. For example, control output signal 111 can comprise seven parallel binary signals carried over seven wires. The control output signal can also be referred as a tuning field because it is used to tune the frequency of the oscillating signal. The reference current generator and the oscillator circuit may together form an oscillator module.

Oscillating signal 102 can drive various different circuits and elements which are not shown. However, the oscillating signal drives at least one frequency sensitive element 115. The frequency sensitive element is an element whose operation depends on the frequency of oscillating signal 102. In the preferred embodiment, the frequency sensitive element can comprise a band pass filter.

It is not required that the frequency sensitive element receive oscillating signal 102 directly as shown in FIG. 1. In some embodiments, the oscillating signal can go through other elements, or can even be modified (e.g., divided) before it reaches frequency sensitive element 115. However, in some embodiments, the signal that reaches frequency sensitive element 115 can have a frequency which is the same as or, alternatively, a function of oscillating signal 102 initially generated by feedback oscillator 100.

The frequency sensitive element can generate control input signal 114, which is sent to controller 112. The control input signal can depend on the frequency of oscillating signal 102, and can indicate the operation of the frequency sensitive element. In some embodiments, the frequency sensitive element can be chosen so that its operation indicates the overall level of operation of the device the present system is placed in. For example, if the frequency response of the entire device varies with temperature, the frequency sensitive element can be chosen so that its frequency response varies with temperature in a similar manner. Thus, if the frequency of the oscillating signal is controlled to ensure the optimal operation of the frequency sensitive element, this will also ensure the optimal operation of the entire device.

Controller 112 monitors control input signal 114 and can modify the control output signal 111 in order to cause the control input signal 114 to have an optimal or desired value. In some embodiments the controller can sweep control output signal 111 in order to discover which value of the control output signal 111 causes the desired value of the control input signal 114. Thus, the controller can effectively tune the frequency of the oscillating current in order to obtain an optimal or acceptable value of input signal 114, and thus an optimal or acceptable operation mode of the device in which the present invention is used.

As discussed above, controller 112 is preferably digital. It can include a dedicated digital circuit, or alternatively, a general purpose microprocessor, or microcontroller which operates according to stored instructions. In some embodiments the control input signal 114 can be analog, therefore a digital controller can include an analog to digital converter for receiving the control input signal 114. In some embodiments, the controller itself can be analog.

If the controller is digital, it may in some embodiments not rely on the oscillating signal as a clock, so that changes of the oscillating signal do not cause changing and unexpected behavior at the controller. Therefore, a different oscillating circuit can be used to provide a clock signal for the controller. The different oscillating circuit can be, for example, a crystal oscillator based circuit.

A person of skill in the art would recognize that different embodiments can change the overall layout of the above discussed circuit 100 while preserving essentially the same function. For example, the voltage of signal 101 can be used as a reference instead of the current. Thus, element 103 can be a voltage comparator, element 108 a frequency to voltage converter, and element 110 a reference voltage generator.

Furthermore, the current or voltage comparator can provide output signal 105 whose current is indicative of the difference between the two inputs (instead of the previous-described case, where the voltage of the signal 105 is significant). In such case a Current Controlled Oscillator can be used instead of Voltage Controlled Oscillator 107. A person of skill in the art would recognize that other modifications are possible as well.

The oscillator circuit of FIG. 1 is typically a fast startup oscillator to allow fast lock after the system wakes up from a lower power management state to scan the multi-touch panel. To reduce the time between wake-up, scanning the multi-touch panel and going back into a lower power state, it is advantageous for the oscillating signal to become stable in a relatively short period in order to minimize the time the system is active and thus to conserve power.

For example, a crystal oscillator may take several milliseconds to stabilize. However, oscillator circuit 100 is capable to stabilize within tens of microseconds, thus enabling the system to go back into a lower power management state much faster as opposed to a system that is driven by a crystal based oscillator.

Figure 2:
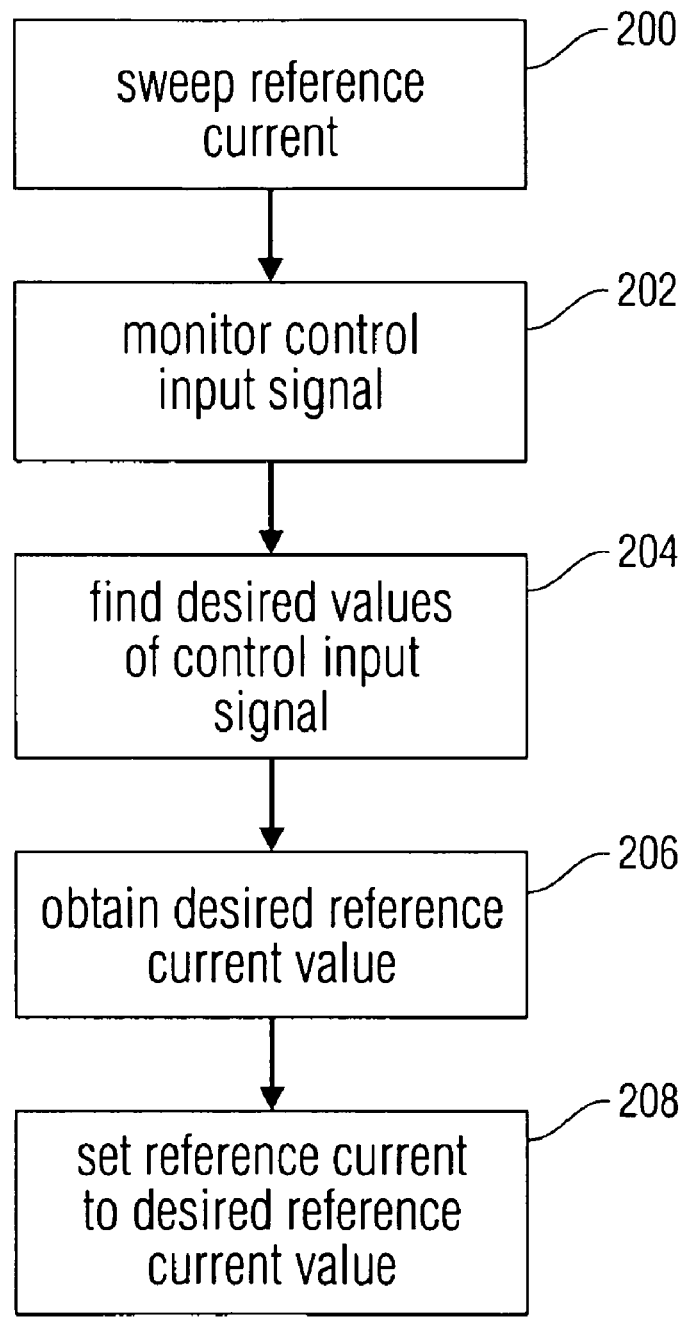
FIG. 2 is a flowchart showing the operation of the controller according to one embodiment of this invention.

FIG. 2 is a flowchart showing the operation of the controller according to exemplary embodiments of the present invention. More specifically it shows a method for tuning the frequency as performed by the controller.

At step 200, the controller may sweep the reference current. The term 'sweep' refers to repeatedly changing the reference current so that eventually the varying magnitudes of the reference current encompass a predefined range. In the preferred embodiment, the sweep can be performed by steps; in other words, the reference current can reach a plurality of discrete magnitudes and maintain each magnitude for a predefined time.

The time at which the reference current is kept at each magnitude during the sweep can be chosen so that the overall system achieves stability for each successive value of the reference current. In other words, each reference current value may be maintained for long enough so that the effects of that value can propagate throughout the circuit. More specifically, each successive value of the reference current during the sweep can be maintained for long enough so that control input signal 114 can stabilize to a state which is associated with the current value of the reference current.

The range of the sweep can be chosen so that the changes of the reference current cause a reasonable range of frequencies of oscillating signal 102 which would not cause any damage or unusual behavior within the overall system. More specifically, the range can be chosen so that it encompasses an optimal frequency as well as a reasonable error range above and below the optimal frequency.

In one embodiment the range can be between 165 and 275 MHz. In this embodiment, the optimal frequency may be 220 MHz and the range can encompass a 25% (55 MHz) error range from that optimal frequency.

At step 202, the controller can monitor the control input signal 114 for each value of reference current 101 during the sweep of the reference current. Step 202 can be performed while step 200 is being performed. In other words, for each value of the reference current during the sweep, the controller can detect the respective value of control input signal 114.

At step 204, the controller can find one or more desired values of control input signal 114. Step 204 can also be performed while steps 200 and 202 are performed. At step 206, the controller obtains a desired reference current value, based on the values of the reference current which caused the various desired values of the control input signal.

At step 208, the controller can set the reference current to the desired reference current value. At this point, the frequency tuning is complete and the system can proceed with ordinary operation.

The controller can perform the tuning discussed in FIG. 2 at the time of manufacture of a device which incorporates embodiments of this invention. Thereafter, the desired reference current can be permanently set and not changed until a reset of the device.

In alternative embodiments, the controller can perform the tuning periodically. This can be useful, because the optimal frequency of the oscillating signal can change as device components age, as the operating environment of the device (e.g. temperature, humidity) changes, or for other reasons. Thus, by periodically performing frequency tuning, the controller can keep the device in optimal operation by dynamically modifying the device's frequency.

In some embodiments, the controller can continuously monitor control input signal 114 even in normal operation (i.e. when frequency tuning is not being performed). If the controller detects that control input signal 114 deviates from desired values, it can modify the reference current in order to bring control signal 114 back within desired values. The reference current can be modified by noting in which direction the value 114 is deviating and increasing or decreasing the reference current accordingly. Alternatively, the reference current can be modified by reinitiating a tuning procedure identical or similar to the one described in FIG. 2 after a deviation of control input signal 114 is detected.

Figure 3:
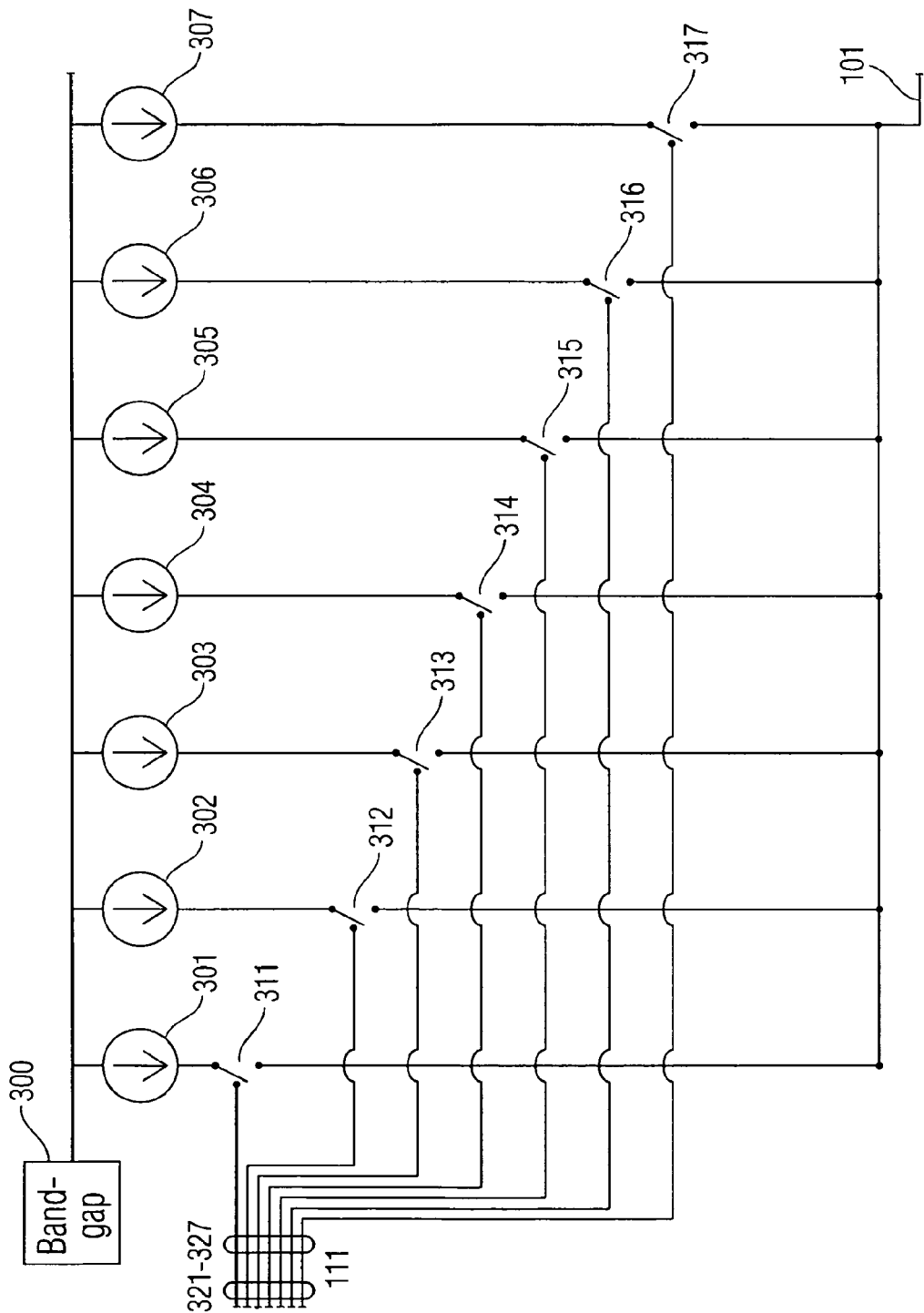
FIG. 3 is a diagram of an exemplary reference current generator according to one embodiment of this invention.

FIG. 3 is a diagram of reference current generator 110 according to exemplary embodiments of the present invention. In the preferred embodiment, the reference current generator can include a plurality of current sources. For example, seven current sources 301-307 (as shown) can be used.

The current sources can be connected to a band gap voltage reference circuit 300, which provides a constant voltage and can be used by the current sources as a reference for generating each current. It is preferable that the band gap provide a reference voltage of about 1.2 to 1.3 volts.

In some embodiments, one or more of the current sources can provide identical currents. However, it is preferred that the current sources provide different currents so that a wider range of possible currents is available by combining different current sources. Assuming a 7 bit wide control bus 111 as shown, the individual current sources 302 to 307 can provide currents which are powers of 2 of current set by current source 301. For example, if current source 301 provides 1 uA of current, current sources 302 to 307 may provide 2, 4, 8, 16, 32, and 64 uA of current respectively, resulting in a total current of 127 uA when all switches are on.

Control output signal 111 can be connected to the reference current generator. In the preferred embodiment, the control output signal includes seven separate binary digital signals 321-327 led on seven separate wires as shown in FIG. 3. Each wire can be connected to one of switches 311 through 317. The switches can be implemented, for example, as MOSFET transistors.

Signals 321-327 can selectively connect and disconnect the various switches according to their respective digital values. When a switch is connected, it causes a current source to connect to that switch to establish connection with the output for reference current 101, and thus contribute its current to reference current 101. Thus, reference current 101 is equal to the sum of the connected current sources.

An offset current source (not shown) can also be provided and connected to output signal 101 in order to provide an offset current. If used, it is preferable that the offset current source is not selectively switched off, so that it can provide a constant minimum current which is present regardless of the value of control output signal 111.

In an alternative embodiment, no switches are used. Instead, digital signals 321-327 can be connected directly to the current sources themselves and can directly turn the current sources on and off.

Thus, the reference current generator can provide a current which is controlled by output control signal 111. Persons of skill in the art would recognize that there are many alternative ways to design the reference current generator. For example, a single voltage source can be used instead, and various resistors can be selectively connected in series or in parallel to the voltage source based on switches controlled by signals 321-327 to vary the current. Alternatively, an amplifier circuit can be used, wherein the various switches 311-317 control the gain of an operational amplifier.

Furthermore, in alternative embodiments, the reference current source can be a reference voltage source. In such an embodiment, feedback oscillator circuit 100 can be configured to create an oscillating signal whose frequency is based on an input reference voltage instead of a reference current. In this embodiment, the reference voltage source can be designed by using multiple voltage sources of different values which can be added or removed in series by a plurality of switches controlled by control signals 321-327.

Referring back to the embodiment shown in FIG. 3, the current magnitudes of the various current sources can be chosen so that they allow a reasonable range of possible total current values to be selected as the reference current. In one embodiment, the current sources are chosen having current values which are powers of 2. Thus, if the smallest current source has a current value x, the other current sources can have values of 2x, 4x, . . . 64x.

Because component signals 321-327 of the control output signal can switch the various current sources off and on, if the current sources are configured according to the above example, the value of control output signal 111 can be treated as a binary number, wherein component signals 321-327 of signal 111 represent digits of that number.

Therefore, in such an embodiment, the controller can select a current having any value from x to 127x which is a multiple of x. For example, if x is 1 uA then, the controller can select the current to be any whole number from 0 uA to 127 uA.

As discussed above, an offset current source can be added as well. Therefore, to continue the above example, if an offset current source of 400 uA is used, then the controller can set the current to any value from 400 uA to 527 uA.

The significance of the possible current values is due to the frequencies of oscillating signal 102 the reference current can produce. Therefore, the magnitudes of the various current sources can be chosen with view as to the frequencies produced by each possible reference current caused by the possible combinations of the current sources.

The relationship between the possible reference currents and the associated frequencies caused by these reference currents depend on the parameters of the various elements within feedback oscillator circuit 100, such as the current comparator 103 and voltage controlled oscillator 107.

Thus, the specific magnitudes of the various current sources within the reference current generator depend on design specific parameters of feedback oscillator circuit 100. A person of skill in the art would recognize how to calculate or test these parameters in order to determine which reference currents the various output frequencies correspond to. Such a person can then specify the magnitudes of the current sources accordingly.

It is noted that the various elements of the feedback oscillator circuit and related circuits can be such that they do not allow a very precise prediction as to the frequency which would result from each reference current. That could be the case because the parameters of the various electronic elements, such as op-amps, resistors, capacitors, band gaps, etc. are not precisely known, or because these parameters can change at different operating conditions.

For example, as discussed above, the output frequencies of most voltage controlled oscillators cannot be exactly predicted, and as a result, voltage controlled oscillators are often placed in PLL circuits where their frequency can be controlled by referring to a signal produced by a crystal. Furthermore, the reference voltages provided by most band gaps are usually not predictable with high precision.

However, in some embodiments of this invention controller 112 monitors the effects of oscillating signal 102 and can modify the frequency of the signal to a desired value. Therefore, embodiments of the present invention effectively address possible uncertainties as to the frequencies produced by the feedback oscillator.

However, in some embodiments it can be important that the range of uncertainty of the feedback oscillator's output be known so that the current generator is designed to produce reference current values which encompass such range of uncertainty.

For example, in a preferred embodiment discussed above, the desired frequency of oscillating signal 102 can be 220 MHz. However, the uncertainty of the feedback oscillator circuit (as well as other relevant elements, such as band gap 300) can be 25%. In other words, if a control signal is applied to the reference current generator and calculations show that that the control signal should cause a reference current which should in turn cause the feedback oscillator circuit to produce output signal 102 with an expected frequency $f_e$, then the actual frequency produced by the feedback oscillator circuit can be $f_a = f_e \pm \pm 25\%$.

Therefore, in the above example, the reference current values can be configured so that they cause the feedback oscillator circuit to produce signals with frequencies which encompass a range of at least ±25% of the desired frequency so that the controller can compensate for any deviations of the feedback oscillator circuit by changing the reference current.

Table 1 shows various values of the control output signal and the respective output frequencies of signal 102 according to an exemplary embodiment of the invention.

TABLE 1

| Value of control output signal | | Expected Frequency |
|---|---|---|
| Decimal | Binary | |
| 0 | 0000000 | 165 (220 − 25%) |
| . | . | . |
| . | . | . |
| 64 | 1000000 | 220 |
| . | . | . |
| . | . | . |
| 127 | 1111111 | 275 (220 + 25%) |

In operation, the controller can initially set the control output signal at 64 which should produce an expected frequency of 220 (which can be the desired frequency). However, if the controller detects from signal 114 (from frequency sensitive element 115) that the frequency sensitive element is not operating in a desired way, then the feedback oscillator circuit may not be producing the expected frequency but some other frequency. In this event, the controller can initiate the sweep procedure discussed in the context of FIG. 2 to find another value of the control output signal which does result in the desired frequency. Thus, after the process of FIG. 2 is completed, the controller can set the control output signal to another value (e.g., 50) which can be associated with a completely different expected frequency (e.g., 205 MHz) but can nevertheless cause the feedback oscillator circuit to produce the desired actual output frequency of 220 MHz.

The frequency sensitive element can be any electronic element which is capable of producing a signal which depends on an incoming frequency. For example, the frequency sensitive element can be a band pass filter.

A band pass filter is a well known electronic element which receives a signal and passes that signal only if its frequency is within a predefined range, or a 'band' of frequencies. Otherwise, the band pass filter more or less attenuates the signal.

Figure 4:
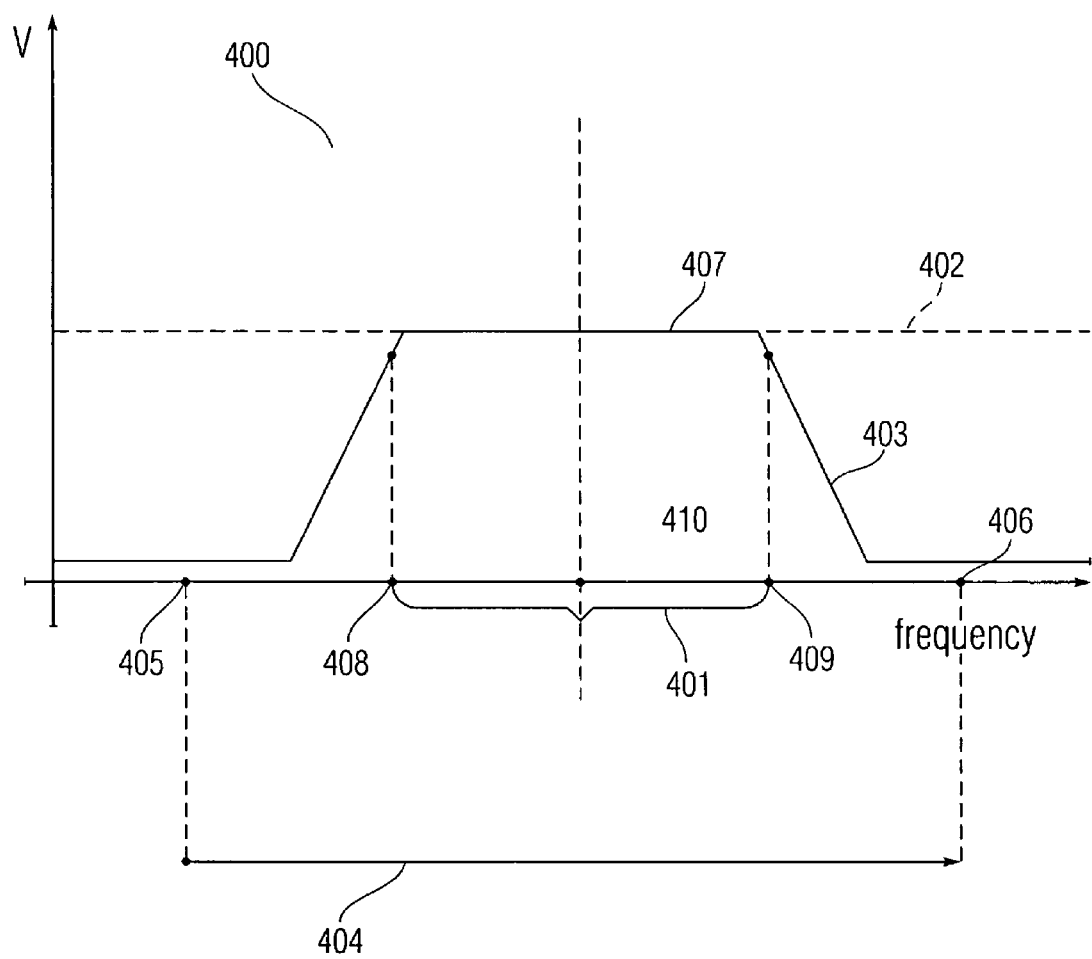
FIG. 4 shows the operation of the controller in the context of a band pass filter according to one embodiment of this invention.

FIG. 4 shows the operation of the controller according to an embodiment of the present invention in which the frequency sensitive element is a band pass filter. Graph 400 shows the frequency response of an exemplary band pass filter. The x-axis is associated with the frequency of the incoming and outgoing signals (which is usually the same), and y-axis is associated with the voltage of the resulting signal (solid line 403) and the voltage of the incoming signal (interrupted line 402). As shown, the y-axis is logarithmic.

It can be seen that the band pass filter can reduce the voltage of the outgoing signal (i.e. attenuate the signal) when the frequency of the signal is outside of predefined band 401, and can allow the incoming signal to pass through without a attenuation when the frequency of the incoming signal is within band 401.

The outgoing signal can be control input signal 114. The input signal can be the oscillating signal 102 or another oscillating signal derived from it. In one embodiment, the controller can be configured to keep the input signal within pass band 401. In other words, the controller can be configured to keep filter output signal 403 (or control input signal 114) at a high voltage.

Arrow 404 indicates a possible frequency range which the controller can generate during the sweep operation discussed in the context of FIG. 2. Thus, the controller can start the sweep by setting the frequency of the oscillating signal 102 (or the filter input signal 402) to value 405 and progressively increase the frequency until it reaches value 406. As discussed above, the controller controls the frequency by sending appropriate signals to the reference current generator 110.

While sweeping the frequency as discussed above, the controller can monitor the voltage of filter output signal 403, by periodically sampling that signal. The controller can detect when the voltage reaches plateau 407 and also detect the value of signal 403 at that plateau (referred to as the high voltage). The controller can also detect two frequencies at which the voltage of the filter output signal 403 is at a level within a certain predefined fraction of the high voltage. The predefined fraction can be, for example, 3 dB down from the maximum value in the center from the passband. These frequencies, 408 and 409 are referred to as the boundaries. The controller can then set the control output signal so that the frequency of the oscillating signal is median frequency 410 which is at equal distances from boundaries 408 and 409. Thus, in this embodiment, the controller sets the frequency so that the oscillating signal is in the middle of the pass band of the band pass filter. Therefore, the oscillating signal is not only at a desired frequency, but it is also at a frequency which allows for some deviation. In other words, if the frequency of the oscillating signal slightly drifts over time, the signal can still be within the pass band.

In an alternative embodiment, the controller can follow a different sweep process. For example, the controller can be configured to sweep the increasing frequencies until the signal is attenuated beyond a set level (or, in other words, until the controller reaches boundary 409). The controller can then set the frequency of the device as the frequency at boundary 409. This method may not provide the most optimal results as it does not set a frequency in the middle of the pass band, but it can be beneficial because it is simpler and it can be performed by a lower cost controller.

There are additional possible methods according to which the controller can sweep the frequency. For example, it can start from high frequencies and continue towards lower frequencies. Or, it can start in a middle frequency which is close to the desired frequency and sweep up and down from that frequency.

In one embodiment, frequency sensitive element 115 can be an element whose only function is to sense the frequency of the oscillating signal 102 and provide a control input signal to the controller indicative of that frequency. Thus, the frequency sensitive element can be a frequency sensor of sorts.

However, in the preferred embodiment, the frequency sensitive element has a useful function in the overall device other than just detecting frequencies. This embodiment is preferable for several reasons. First, if an element which is already used for another function is used as the frequency sensitive element, the overall cost of the device can be decreased as no dedicated frequency sensitive element is required.

Another reason is that if an otherwise useful element is used as the frequency sensitive element, the controller can provide a further benefit by compensating the frequency for deviations of the frequency sensitive element as well as deviations within the feedback oscillator circuit and the reference current generator circuit.

Portions of the previous description emphasize the benefit of embodiments of the present invention in terms of compensating for deviations in the feedback oscillator circuit and the reference current generator circuit. Thus, for example if the desired frequency is 220 MHz and the feedback oscillator circuit runs at 200 MHz, the controller can change the control signal 111 in order to cause the feedback oscillator circuit to run at 220 MHz. However, it is possible that frequency related deviations can occur not only in the circuit 100 that generates an oscillating signal, but in elements and circuits that use the oscillating signal. For example, a certain element can be initially designed to use oscillating signal 102 and operate optimally when the oscillating signal is at 220 MHz. However, due to manufacturing inconsistencies and/or changes in the environmental conditions, the element can deviate to the point where its optimal frequency is 210 MHz.

If this element is used as the frequency sensitive element, embodiments of the present invention can compensate for that deviation by causing the feedback oscillator circuit to output an oscillating signal at 210 MHz instead. This can be accomplished because the frequency sensitive element can output the control input signal 114 which can indicate how well the frequency sensitive element is operating. Thus, a deviation which causes the frequency sensitive element to change its optimal operating frequency can result in a change in signal 114. Controller 112 can notice that change and modify the frequency of oscillating signal 102 in order to place the frequency sensitive element in its new optimal operating frequency.

Thus, the controller can modify the frequency of signal 102 to compensate for errors and deviations within a circuit that creates an oscillating signal (circuits 100, 110), a circuit that uses the oscillating signal (circuit 115) or both.

Figure 5:
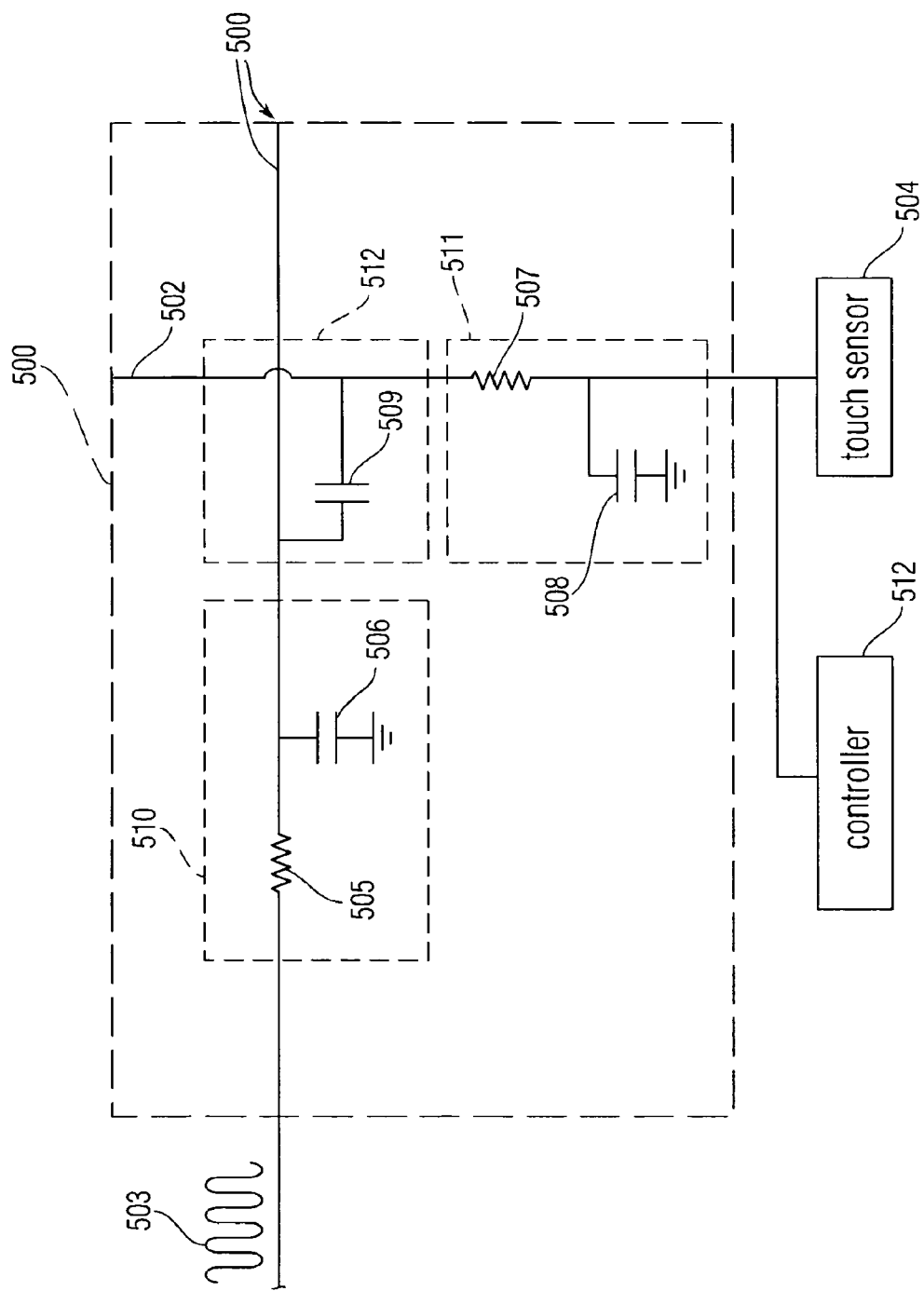
FIG. 5 is a diagram showing a portion of a touch sensitive panel of a mobile device according to one embodiment of this invention.

An example of a frequency sensitive element 115 which possesses an independent utility as discussed above is shown in FIG. 5. More specifically, FIG. 5 shows portion of a touch sensitive panel of a mobile device, e.g., a mobile telephone or a digital audio or audio/video player.

Area 500 can be a portion of the touch sensitive panel. Wires (or electrodes) 501 and 502 can be used to sense touches on the panel. Oscillating signal 503 can be input at wire 501. This signal can be the same as oscillating signal 102. The intersection of wires 501 and 502 is considered to be a pixel-like area at which touches of the panel can be detected.

A touch sensor 504 can be connected to wire 502 in order to sense when the panel is touched at the intersection of wires 501 and 502. In the preferred embodiment, the touch sensor determines whether the panel has been touched by detecting changes of capacitance 509 between the two wires, which are usually caused by effect of a finger or another object touching the panel at or around the intersection of the two wires. The controller 112 can also be connected to wire 502, thus making the signal coming from wire 502 the control input signal 114.

Each wire has an associated resistance and capacitance (505 and 506 for wire 501 and 507 and 508 for wire 502) which are the result of known properties of wires and interactions between each wire and other portions of the panel (i.e., a grounded back plate of the panel.) Because the wires are part of a panel, they are preferably transparent. Therefore, their intrinsic resistances 505 and 507 can be more pronounced than those for ordinary metal wires, as is usual for transparent wires. There can also exist capacitance 509 caused by the interactions between the two wires.

According to known properties of filters, the resistance 505 and capacitance 506 form a low pass filter 510, while capacitance 508 and resistance 507 form another low pass filter 511. On the other hand, capacitance 509 forms a high pass filter 512.

Thus, in order for signal 503 to get to touch sensor 504 and controller 112, it must pass through two low pass filters and a high pass filter. The combination of these filters can result in an effective band pass filter which allows signal 503 to pass only if its frequency is within a certain pass band.

It can be a requirement for the operation of the overall device that the signal passes through the thus created band pass filter. That requirement can exist, for example, because if the signal does not pass, touch sensor 504 will not be able to detect whether this particular portion of the panel has been touched or not.

Therefore, controller 112 can monitor the signal at wire 502 and control the frequency of the incoming signal 503 in order to ensure that the signal is within the pass band of the band pass filter formed by panel 500. This monitoring can be performed as discussed above (see, e.g., discussion of FIG. 4).

Thus, panel 500 can be frequency sensitive element 115. However, panel 500 is not there for the sole purpose of being a frequency sensing element. It has another function (i.e., sensing touches thereon) which is dependent on the frequency of an input oscillating signal. The controller can monitor an output of the panel and control the frequency of the input signal to ensure that the panel operates at optimal or at least acceptable manner.

Thus, the controller can compensate for deviations in the feedback oscillator circuit and related circuits (such as the reference current generator) which generate signal 503 as well as deviations in panel 500.

Therefore, in the preferred embodiments, the present invention generates an oscillating signal which compensates for two types of uncertainties—the uncertainties associated with elements generating the oscillating signal and the uncertainties associated with elements using the oscillating signal.

Figure 6:
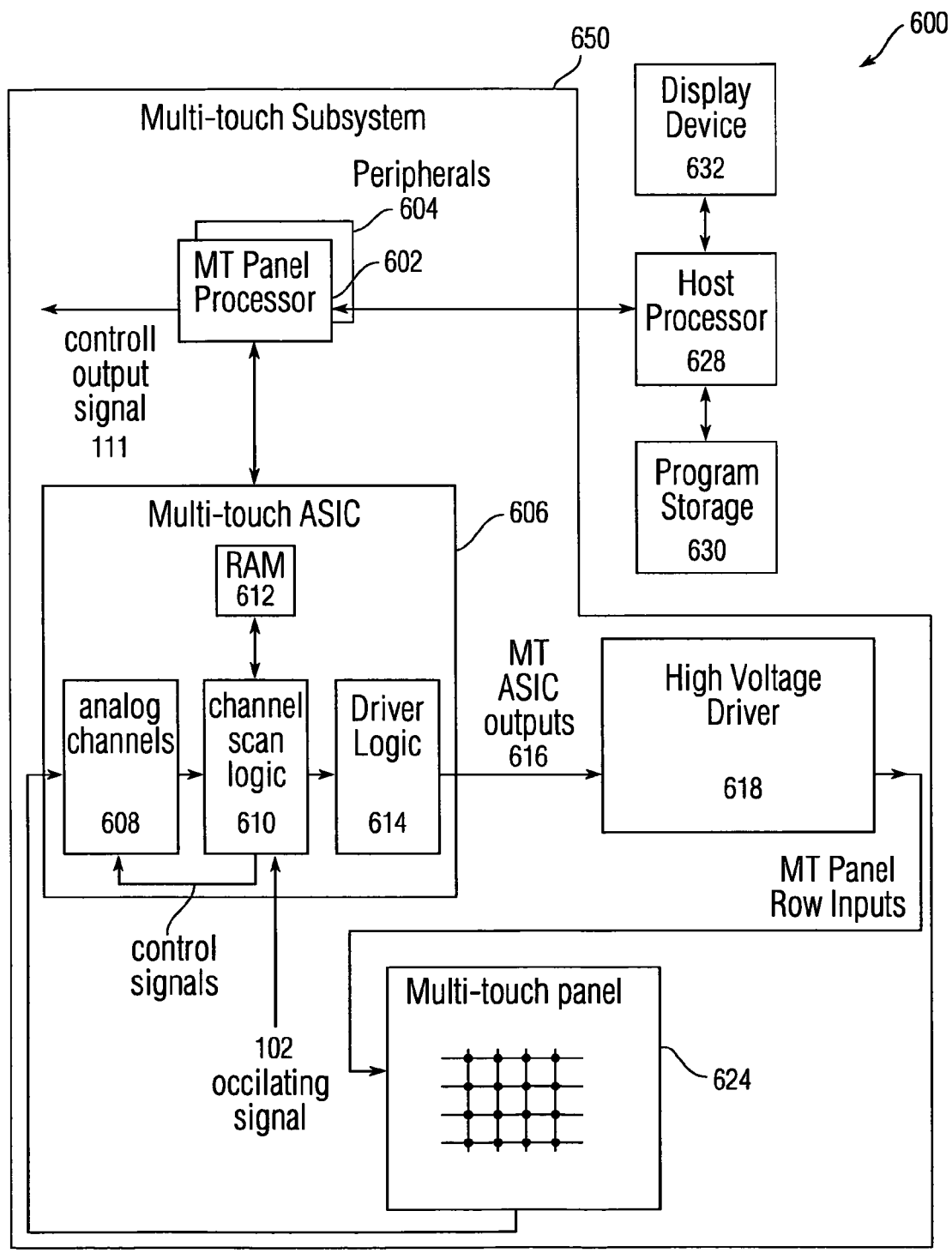
FIG. 6 is a diagram of an device which can feature an embodiment of this invention.

FIGS. 6-8 illustrate an exemplary device which may use the present invention. More specifically, FIG. 6 illustrates exemplary computing system 600 that uses multi touch panel 624. Computing system 600 can include multi-touch subsystem 650 which performs functions in relation to the multi-touch panel and additional device elements (such as host processor 628, display device 632, and program storage 630) which are not directly related to the multi-touch functionality. The multi-touch subsystem can include one or more multi touch panel processors 602 and peripherals 604, and multi touch ASIC 606. One or more processors 602 can comprise ARM968 processors or other processors with similar functionality and capabilities. However, in other embodiments, the multi touch panel processor functionality can be implemented instead by dedicated logic such as a state machine. Peripherals 604 can include, but are not limited to, random access memory (RAM) or other types of memory or storage, watchdog timers and the like. The multi touch ASIC 606 can include, but is not limited to, one or more analog channels 608, channel scan logic 610 and driver logic 614. The channel scan logic 610 can access RAM 612, autonomously read data from the analog channels and provide control for the analog channels. This control can include multiplexing columns of the multi touch panel 624 to the analog channels 608. In addition, the channel scan logic 610 can control the driver logic and stimulation signals being selectively applied to rows of the multi touch panel 624. In some embodiments, the multi touch ASIC 606 can be integrated into a single application specific integrated circuit (ASIC).

Driver logic 614 can provide multiple multi touch ASIC outputs 616 and can present a proprietary interface that drives a high voltage driver 618. The high voltage driver 618 may provide level shifting from a low voltage level (e.g. CMOS levels) to a higher voltage level, providing a better signal-to-noise (S/N) ratio for noise reduction purposes. The high voltage driver may also de-multiplex a single signal received from the multi-touch ASIC into multiple different multi-touch panel row inputs, each output being associated with one or more rows of the multi touch panel. Thus, each multi touch panel row input 622 can drive one or more rows in a multi touch panel 624. In some embodiments, the high voltage driver 618 can be integrated into a single ASIC. However, in other embodiments the high voltage driver 618 can be integrated into the driver logic 614, and in still other embodiments the high voltage driver 618 can be eliminated entirely.

Multi touch panel 624 can in one embodiment include a plurality of electrodes such as the ones shown in FIG. 5. These can be used to determine whether different portions of the panel (or pixels) have been touched. This determination can be made in the manner discussed above with reference to FIG. 5.

More generally, multi-touch panel 124 can in some embodiments include a capacitive sensing medium having a plurality of row traces or driving lines and a plurality of column traces or sensing lines, although other sensing media may also be used. The row and column traces may be formed from a transparent conductive medium, such as Indium Tin Oxide (ITO) or Antimony Tin Oxide (ATO), although other transparent and non-transparent materials, such as copper, can also be used. In some embodiments, the row and column traces can be formed on opposite sides of a dielectric material, and can be perpendicular to each other, although in other embodiments other non-orthogonal orientations are possible. For example, in a polar coordinate system, the sensing lines can be concentric circles and the driving lines can be radially extending lines (or vice versa). It should be understood, therefore, that the terms "row" and "column," "first dimension" and "second dimension," or "first axis" and "second axis" as used herein are intended to encompass not only orthogonal grids, but the intersecting traces of other geometric configurations having first and second dimensions (e.g. the concentric and radial lines of a polar-coordinate arrangement). It should also be noted that in other embodiments, the rows and columns can be formed on a single side of a substrate, or can be formed on two separate substrates separated by a dielectric material. In some embodiments, the dielectric material can be transparent, such as glass, or can be formed from other materials, such as mylar. An additional dielectric cover layer may be placed over the row or column traces to strengthen the structure and protect the entire assembly from damage.

At the "intersections" of the traces, where the traces pass above and below each other (but do not make direct electrical contact with each other), the traces essentially form two electrodes (although more than two traces could intersect as well). Each intersection of row and column traces can represent a capacitive sensing node and can be viewed as a pixel, which can be particularly useful when multi-touch panel 624 is viewed as capturing an "image" of touch. (In other words, after multi-touch subsystem 606 has determined whether a touch event has been detected at each touch sensor in the multi-touch panel, the pattern of touch sensors in the multi-touch panel at which a touch event occurred can be viewed as an "image" of touch (e.g. a pattern of fingers touching the panel).) The capacitance between row and column electrodes appears as a stray capacitance on all columns when the given row is held at DC and as a mutual capacitance Csig when the given row is stimulated with an AC signal. The presence of a finger or other object near or on the multi-touch panel can be detected by measuring changes to Csig. The columns of multi-touch panel 624 can drive one or more analog channels 108 (also referred to herein as event detection and demodulation circuits) in multi-touch subsystem 606. In some embodiments, each column is coupled to one dedicated analog channel 608. However, in other embodiments, the columns may be couplable via an analog switch to a fewer number of analog channels 608.

Computing system 600 can also include a host processor 628 for receiving outputs from the multi touch panel processor 602 and performing actions based on the outputs that may include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. The host processor 628 may also perform additional functions that may not be related to multi touch panel processing, and may be coupled to program storage 632 and a display device 630 such as an LCD display for providing a user interface (UI) to a user of the device. In another embodiment, the multi touch panel may be used as the computing system's only display device.

In an alternative embodiment a proximity sensor panel can be used instead of the multi touch panel. The proximity sensor panel may sense hover events—i.e., events in which a finger or another object is placed in proximity to the panel instead of touching it. The proximity sensor panel may be configured in a manner similar to that of the multi touch sensor panel. However instead of using capacitances between the various row and column electrodes as the sensors, a light emitting diode (LED) and a light sensor (i.e., a photo diode) may be used for each pixel. The row electrodes can be connected to the LEDs of each row and the column electrodes can be connected to the light sensors of each column. Thus, the proximity sensor panel can sense multiple hover events in a manner similar to that of the multi touch panel discussed above. The proximity sensor and touch sensor functionalities can be combined in a single multi sense panel.

Figure 7A:
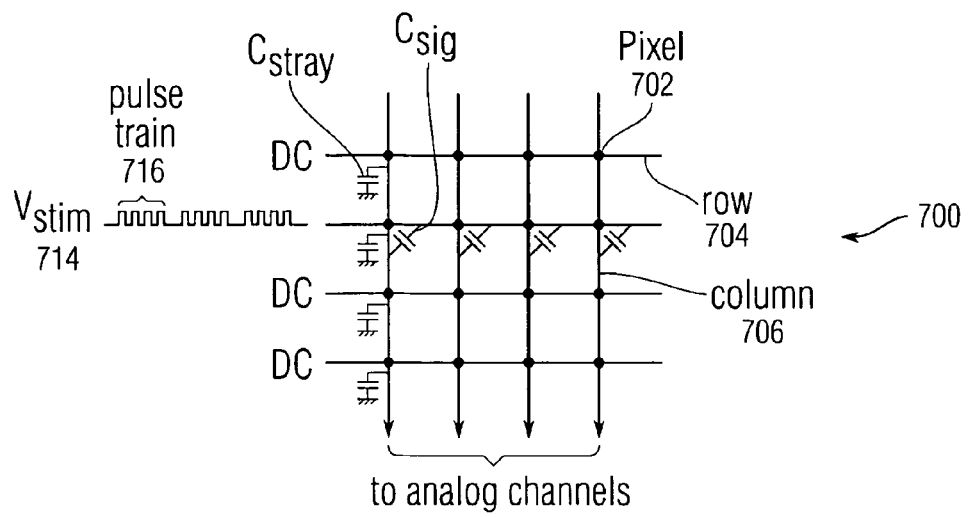
FIG. 7a illustrates an exemplary capacitive multi-touch panel.

FIG. 7a illustrates exemplary capacitive multi-touch panel 700. FIG. 7a indicates the presence of a stray capacitance Cstray at each pixel 702 located at the intersection of a row (such as row 704) and a column (such as column 706) trace. Note that although FIG. 7a illustrates the rows and columns as being substantially perpendicular, they need not be so aligned, as described above. In the example of FIG. 7a, an AC stimulus Vstim 714 is being applied to one row, with all other rows connected to DC. The stimulus causes a charge to be injected into the column electrodes through mutual capacitance at the intersecting points. This charge is Qsig=Csig×Vstm. Each of the columns can be selectively connectable to one or more analog channels (see analog channels 608 in FIG. 6).

Figure 7B:
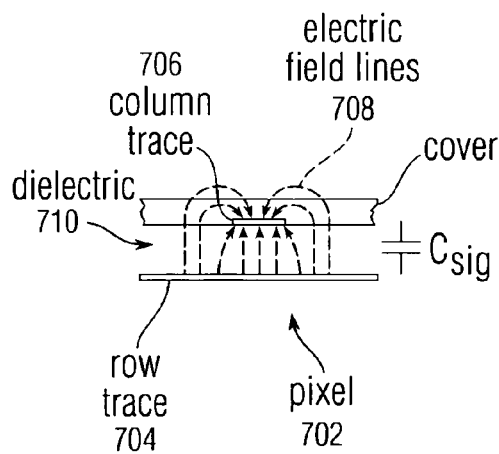
FIG. 7b is a side view of an exemplary capacitive touch sensor or pixel in a steady-state (no-touch) condition.

FIG. 7b is a side view of exemplary pixel 702 in a steady-state (no-touch) condition. In FIG. 7b, an electric field comprised of electric field lines 708 between the column 706 and row 704 traces or electrodes separated by a dielectric 710 can create a signal capacitance Csig between the row and column electrodes when a stimulus is applied to the row trace.

Figure 7C:
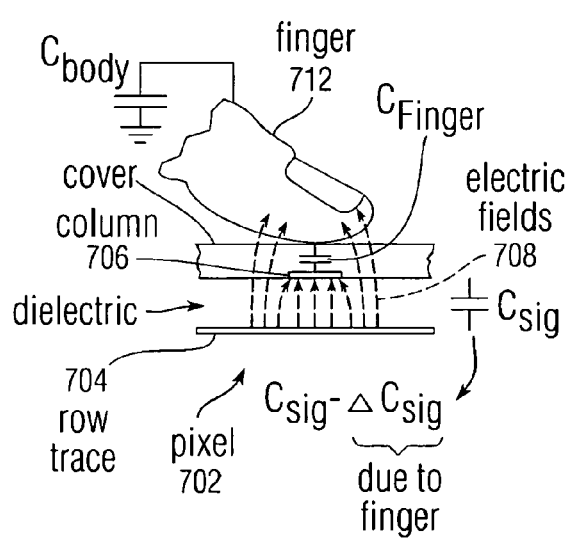
FIG. 7c is a side view of the exemplary capacitive touch sensor or pixel in a dynamic (touch) condition.

FIG. 7c is a side view of exemplary pixel 702 in a dynamic (touch) condition. In FIG. 7c, finger 712 has been placed near the pixel 702. Finger 712 represents an AC return path to ground via body capacitance Cbody, which typically depends on the size and shape of the body and can be several 100 picofarads, If finger 712 blocks some of electric field lines 708 appearing between the row and column electrodes (those fringing fields that exit the dielectric and pass through the air above the row electrode), those electric field lines are shunted to ground through the body capacitance Cbody, and as a result, the steady state signal capacitance Csig is reduced by ΔCsig. In other words, the combined body and finger act to reduce Csig by an amount ΔCsig (which also can be referred to herein as Csig_sense) by acting as a shunt or dynamic return path to ground, blocking some of the electric fields and resulting in a reduced net signal capacitance. The signal capacitance at the pixel becomes Csig−ΔCsig, where Csig represents the static (no touch) component and ΔCsig represents the dynamic (touch) component. Note that Csig−ΔCsig can always be nonzero due to the inability of a finger, palm or other object to block all electric fields, especially those electric fields that remain entirely within the dielectric material. In addition, it should be understood that as a finger is pushed harder or more completely onto the multi-touch panel, the finger can tend to flatten, blocking more and more of the electric fields, and thus ΔCsig can be variable and representative of how completely the finger is pushing down on the panel (i.e., a range from "no-touch" to "full-touch").

Referring again to FIG. 7a, as mentioned above, Vstim signal 714 can be applied to a row in multi-touch panel 700 so that a change in signal capacitance can be detected when a finger, palm or other object is present. Vstim signal 714 can comprise one or more pulse trains 716 at a particular frequency, with each pulse train comprised of a number of pulses. Although the pulse trains 716 are shown as square waves, other wave shapes such as sine waves can also be employed. Plural pulse trains 716 at different frequencies can be transmitted for noise reduction purposes to detect and avoid noisy frequencies. Vstim signal 714 essentially injects a charge into the row, and can be applied to one row of the multi-touch panel 700 at a time while all other rows are held at a DC level. However, in other embodiments, the multi-touch panel can be divided into two or more sections, with Vstim signal 714 being simultaneously applied to one row in each section and all other rows in that region section held at a DC voltage.

Each analog channel coupled to a column measures the mutual capacitance formed between that column and the row. This mutual capacitance is comprised of the signal capacitance Csig and any change Csig_sense in that signal capacitance due to the presence of a finger, palm or other body part or object. These column values provided by the analog channels can be provided in parallel while a single row is being stimulated, or can be provided in series. If all of the values representing the signal capacitances for the columns have been obtained, another row in multi-touch panel 700 can be stimulated with all others held at a DC voltage, and the column signal capacitance measurements can be repeated. Eventually, if Vstim has been applied to all rows, and the signal capacitance values for all columns in all rows have been captured (i.e., entire multi-touch panel 700 has been "scanned"), a "snapshot" of all pixel values can be obtained for entire multi-touch panel 700. This snapshot data can be initially saved in the multi-touch ASIC, and later transferred out for interpretation by other devices in the computing system such as the host processor. As multiple snapshots are obtained, saved and interpreted by the computing system, it is possible for multiple touches to be detected, tracked, and used to perform other functions.

Figure 8A:
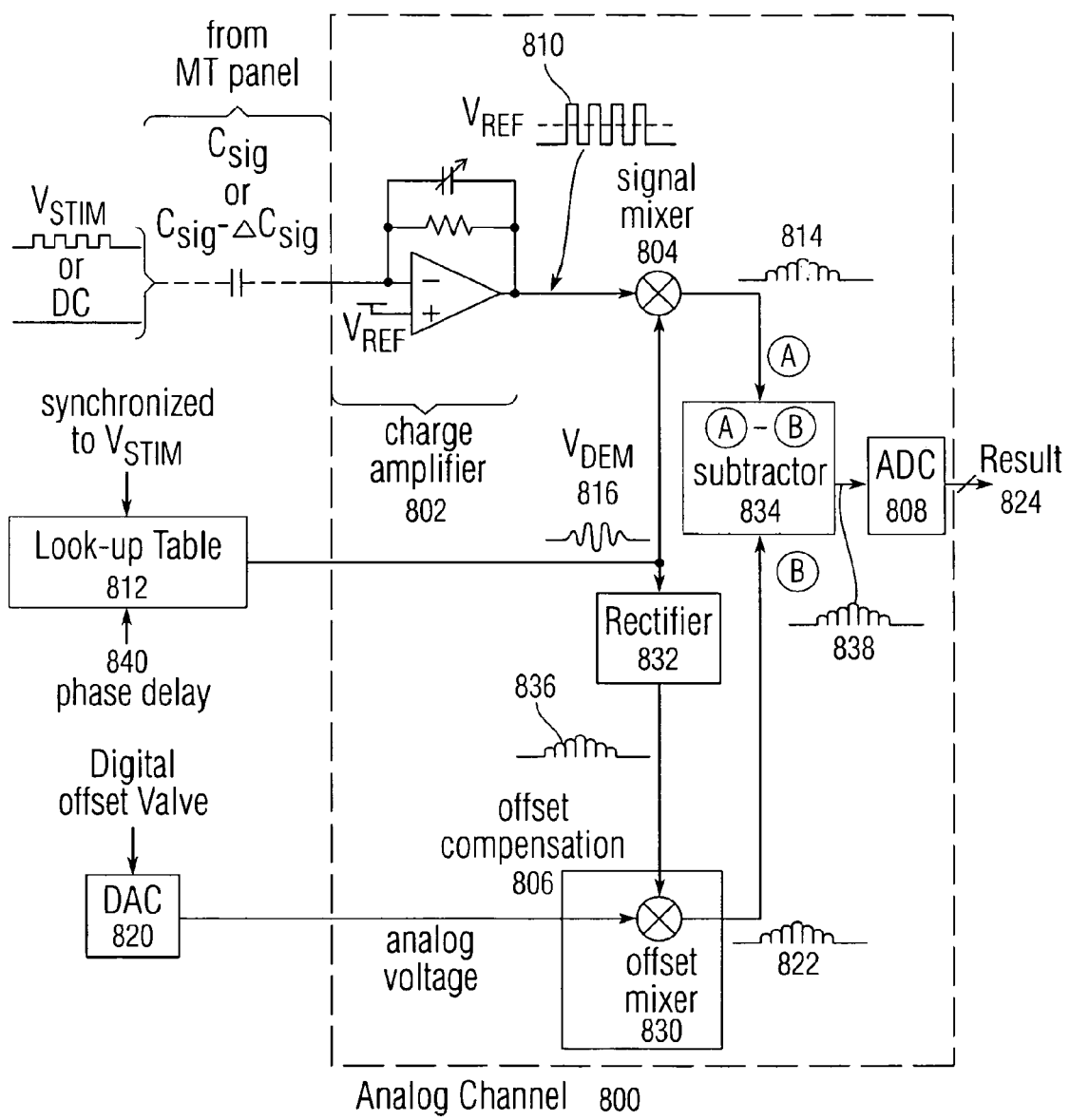
FIG. 8a illustrates an exemplary analog channel.

FIG. 8a illustrates exemplary analog channel 800. One or more analog channels 800 can be present in the multi-touch ASIC. One or more columns from a multi-touch panel can be connectable to each analog channel 608. Each analog channel 800 can include virtual-ground charge amplifier 802, signal mixer 804, offset compensation 806, rectifier 832, subtractor 834, and analog-to-digital converter (ADC) 808. FIG. 8a also shows, in dashed lines, the steady-state signal capacitance Csig that can be contributed by a multi-touch panel column connected to the analog channel 800 when an input stimulus Vstim is applied to a row in the multi-touch panel and no finger, palm or other object is present, and the dynamic signal capacitance Csig–ΔCsig that can appear when a finger, palm or other object is present.

Vstim, as applied to a row in the multi-touch panel, can be generated as a burst of square waves or other non-DC signaling in an otherwise DC signal, although in some embodiments the square waves representing Vstim can be preceded and followed by other non-DC signaling. If Vstim is applied to a row and a signal capacitance is present at a column connected to analog channel 800, the output of the charge amplifier 802 can be a pulse train 810 centered at Vref (a constant reference voltage) with a peak-to-peak (p-p) amplitude in the steady-state condition that is a fraction of the p-p amplitude of Vstim, the fraction corresponding to the gain of charge amplifier 802. For example, if Vstim is comprised of 18V p-p pulses and the gain of the charge amplifier is 0.1, then the output of the charge amplifier can be 1.8V p-p pulses. This output can be mixed in signal mixer 804 with demodulation waveform Vdem 816.

Because Vstim can create undesirable harmonics, especially if comprised of square waves, the demodulation waveform Vdem 816 can be a Gaussian sine wave in an otherwise DC signal that is digitally generated from look-up table (LUT) 812 or other digital logic and synchronized to Vstim. In some embodiments, Vdem 816 can be tunable in frequency and amplitude by selecting different digital waveforms in LUT 812 or generating the waveforms differently using other digital logic. Signal mixer 804 can demodulate the output of charge amplifier 810 by mixing Vdem 816 with the output to provide better noise rejection. Signal mixer 804 can reject all frequencies outside the passband, which can in one example be about ±15 kHz around the stimulation signal. This noise rejection can be beneficial in a noisy environment with many sources of noise, such as 802.11, Bluetooth and the like, all having some characteristic frequency that can interfere with sensitive (femtofarad level) analog channel 800. In one embodiment the frequencies of the signals going into signal mixer 804 may be the same. In this case, signal mixer 804 is essentially a synchronous rectifier, and as a result, signal mixer output 814 would be a rectified Gaussian sine wave. In one embodiment Vdem can be tunable by phase, based on phase delay signal 840. The phase delay signal can be generated by the channel scan logic in order to ensure that the phase of Vdem matches that of the output signal of the amplifier circuit. Thus, mixing Vdem with that output signal can ensure optimal results.

Offset compensation 806 can then be applied to signal mixer output 814 at subtractor 834, which can remove the effect of the static Csig, leaving only the effect of ΔCsig appearing as result 824. Offset compensation 806 can be implemented using offset mixer 830. Offset compensation output 822 can be generated by rectifying Vdem 816 using rectifier 832, and mixing rectifier output 836 with an analog voltage from digital-to-analog converter (DAC) 820 in the offset mixer 830. Digital to Analog Converter 820 can generate the analog voltage based on a digital value selected to increase the dynamic range of analog channel 800. Offset compensation output 822, which can be proportional to the analog voltage from DAC 820, can then be subtracted from signal mixer output 814 using a subtractor 834, producing subtractor output 838 which can be representative of the change in the AC capacitance ΔCsig that occurs when a capacitive sensor on the row being stimulated has been touched. Subtractor output 838 can then be converted to a digital value by ADC 808. In one embodiment, ADC 808 can be a sigma-delta ADC, which can sum a number of consecutive digital values and average them to generate result 824.

Figure 8B:
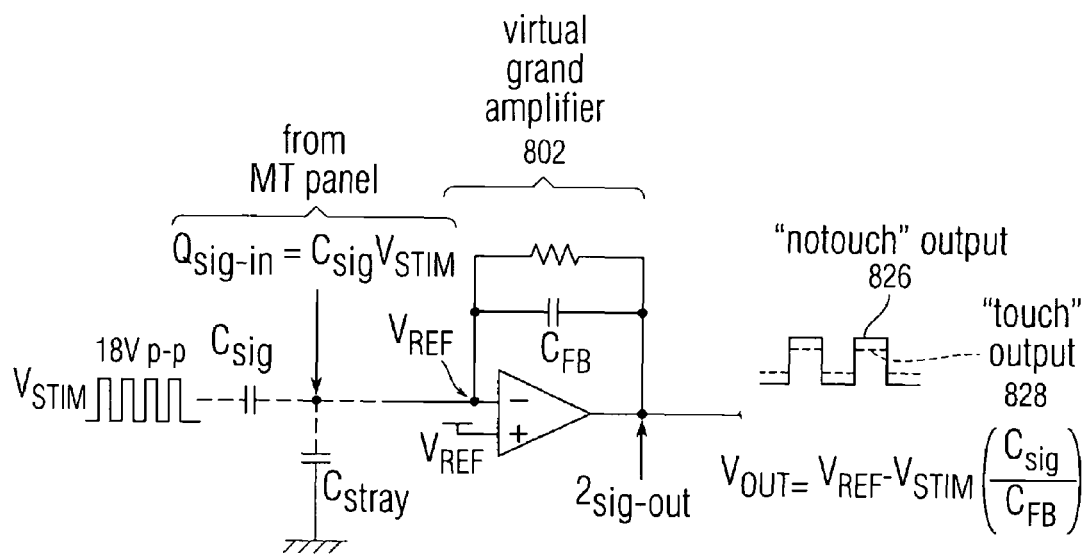
FIG. 8b is a more detailed illustration of a virtual ground charge amplifier at the input of an analog channel, and the capacitance contributed by a capacitive touch sensor and seen by the charge amplifier.

FIG. 8b is a more detailed view of charge amplifier (or virtual ground amplifier) 802 at the input of an analog channel, and the capacitance that can be contributed by the multi-touch panel (see dashed lines) and seen by the charge amplifier. As mentioned above, there can be an inherent stray capacitance Cstray at each pixel on the multi-touch panel. In virtual ground amplifier 802, with the noninverting (+) input tied to Vref, the inverting (−) input is also driven to Vref, and a DC operating point is established. Therefore, regardless of how much stray capacitance Cstray is present, the inverting input is always driven to Vref. Because of the characteristics of virtual ground amplifier 802, any charge Qstray that is stored in Cstray is constant, because the voltage across Cstray is kept constant by the charge amplifier. Therefore, no matter how much stray capacitance Cstray is added to the −input, the net charge into Cstray will always be zero. Therefore the input charge Qsig_sense=(Csig−ÄCsig_sense)Vstim is zero when the corresponding row is kept at DC and is purely a function of Csig and Vstim when the corresponding row is stimulated. In either case, because there is not net charge into stray capacitance Cstray, Cstray is rejected, and essentially drops out of any equations. Thus, even with a hand over the multi-touch panel, although Cstray can increase, the output will be unaffected by the change in Cstray.

The gain of virtual ground amplifier 802 is usually small (e.g. 0.1) and is equivalent to the ratio of Csig (e.g. 2 pF) and feedback capacitor Cfb (e.g. 20 pF). The adjustable feedback capacitor Cfb converts the charge Qsig to the voltage Vout. Therefore, the output Vout of virtual ground amplifier 802 is a voltage that is equivalent to the ratio of −Csig/Cfb multiplied by Vstim referenced to Vref. The high voltage Vstim pulses can therefore appear at the output of virtual ground amplifier 802 as much smaller pulses having an amplitude identified by reference character 826. However, when a finger is present, the amplitude of the output can be reduced as identified by reference character 828, because the signal capacitance is reduced by ΔCsig.

Figure 8C:
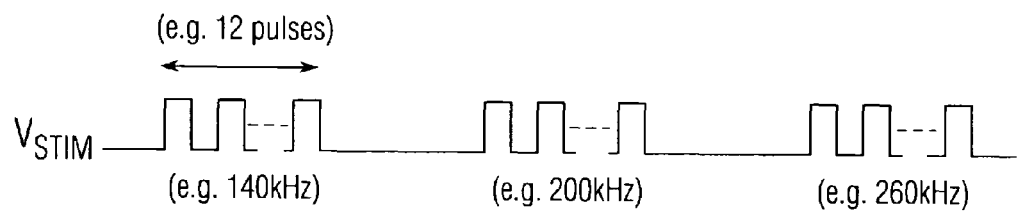
FIG. 8c illustrates an exemplary Vstim signal with multiple pulse trains each having a fixed number of pulses, each pulse train having a different frequency.

FIG. 8c illustrates an exemplary Vstim signal with multiple pulse trains each having a fixed number of pulses, each pulse train having a different frequency (e.g. 140 kHz, 200 kHz, and 260 kHz). With multiple pulse trains at different frequencies, one or more results can be obtained at each frequency. If a static interference is present at a particular frequency, the results at that frequency can be corrupted as compared to the results obtained at the other two frequencies, and those results can be eliminated. The results at the remaining two frequencies can be averaged to compute the result.

The multiple frequencies can be applied in different ways to the multi-touch panel. In some embodiments, the same frequency can be sequentially applied to all channels (rows) (i.e. scanning one frame at a single frequency), and then repeated for the other two frequencies. In other embodiments, a low, medium and high frequencies can be applied to one channel, before moving on to the next channel. After an entire "image" is captured, it can be processed. The various applied frequencies can be programmable. The feedback capacitance Cfb and offset can also be programmable.

Referring back to FIG. 6, the circuits of an embodiment of the present invention may be implemented as part of the Multi-touch ASIC 606. Oscillating signal 102 generated by an embodiment of the present invention may be sent to channel scan logic 610. The oscillating signal may then be used as a reference for the generation of various stimulation signals Vstim which are eventually sent to the rows of the multi-touch panel 624.

Thus, the frequency of Vstim can be based on oscillating signal 102. However, in some embodiments the frequency of Vstim is not equal to the frequency of the oscillating signal but a function of it. For example, the frequency of Vstim may be obtained by dividing the oscillating signal. As shown in FIG. 8c, Vstim may include two or more bursts of different frequencies. These bursts can be generated with reference to oscillating signal 102, by dividing the oscillating signal by different factors. Alternatively they can be generated by changing the frequency of the oscillating signal by periodically sending different control output values (or tuning values) to the reference current generator.

Thus, in the specific embodiment shown by FIG. 6, multi-touch panel 624 may be analogous to frequency sensitive element 115 of FIG. 1. The multi touch panel receives stimulation signals whose frequencies are based on the frequency of oscillation signal 112 (but not necessary equal to it) and outputs signals at its column electrodes which are at least partially based on the input stimulation frequency. Therefore, the outputs are also at least partially based on the frequency of oscillation signal 102.

Figure 9:
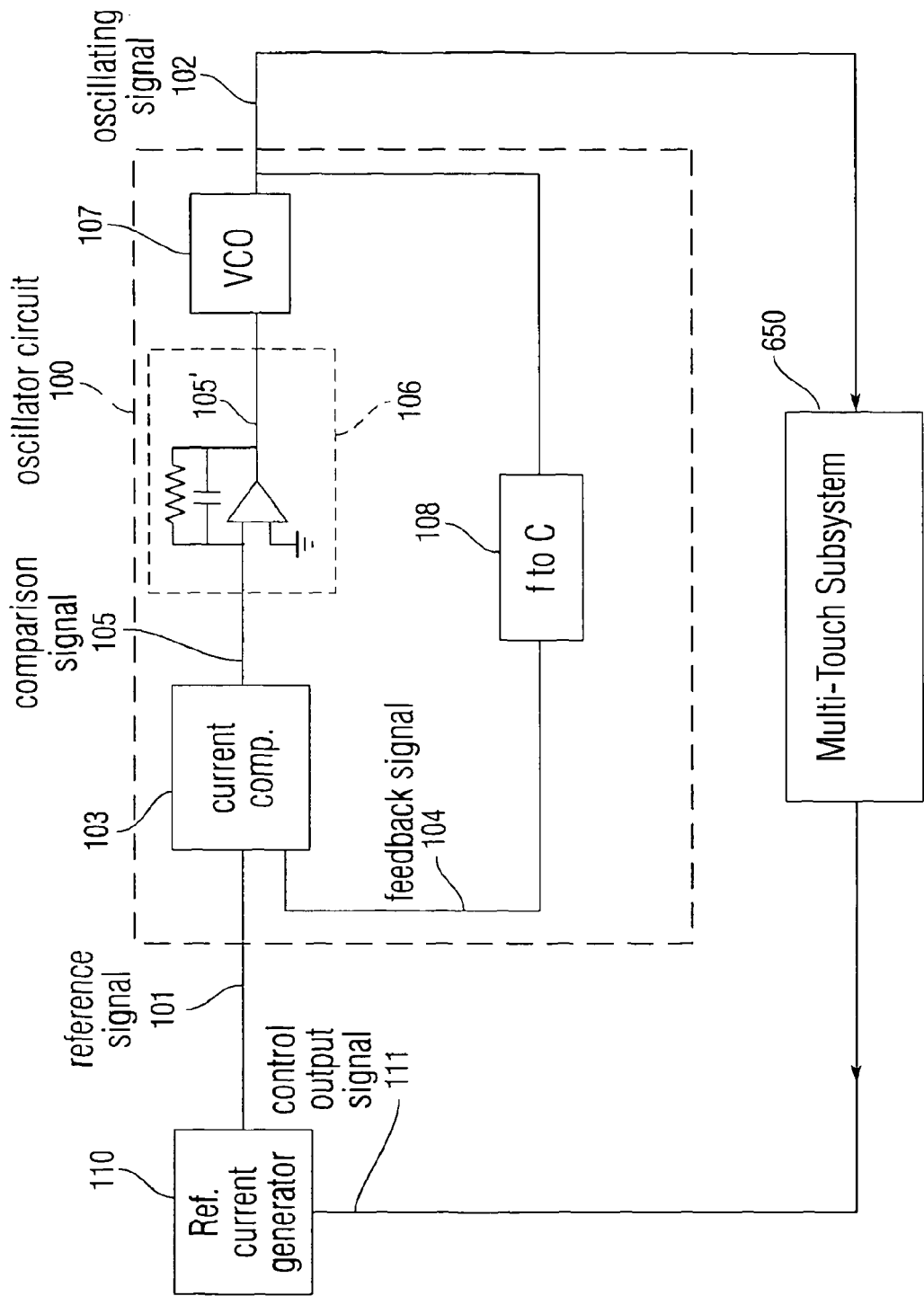
FIG. 9 is a diagram of an embodiment of the invention featuring a multi-touch subsystem.

As discussed above, the output signals can be processed by respective analog channels 608 and channel scan logic 610 and sent (in digital representation) to multi channel processor 602. The multi-channel panel processor can perform the role of controller 112. In other words, it can examine the signals and determine based on these signals whether the frequency of the oscillating signal is at a desired level. If this is not the case, the multi-channel panel processor can modify and control the frequency of the oscillating signal by generating a suitable control output signal 111. The frequency of the oscillating signal can be controlled by the multi touch panel processor in order to maximize the value of result signal 824. Since the magnitude of signal 824 is used to determine whether a touch even occurs, setting up the stimulation frequency to maximize this magnitude ensures a higher resolution or, in other words, a broader range of possible values for the result signal FIG. 9 is a diagram of the above discussed embodiment of the invention in which different parts of multi-touch subsystem 650 perform the roles of the frequency sensitive element and the controller. As discussed above, the entire circuit shown in FIG. 9 can also be part of the multi-touch subsystem 650.

Figure 10A:
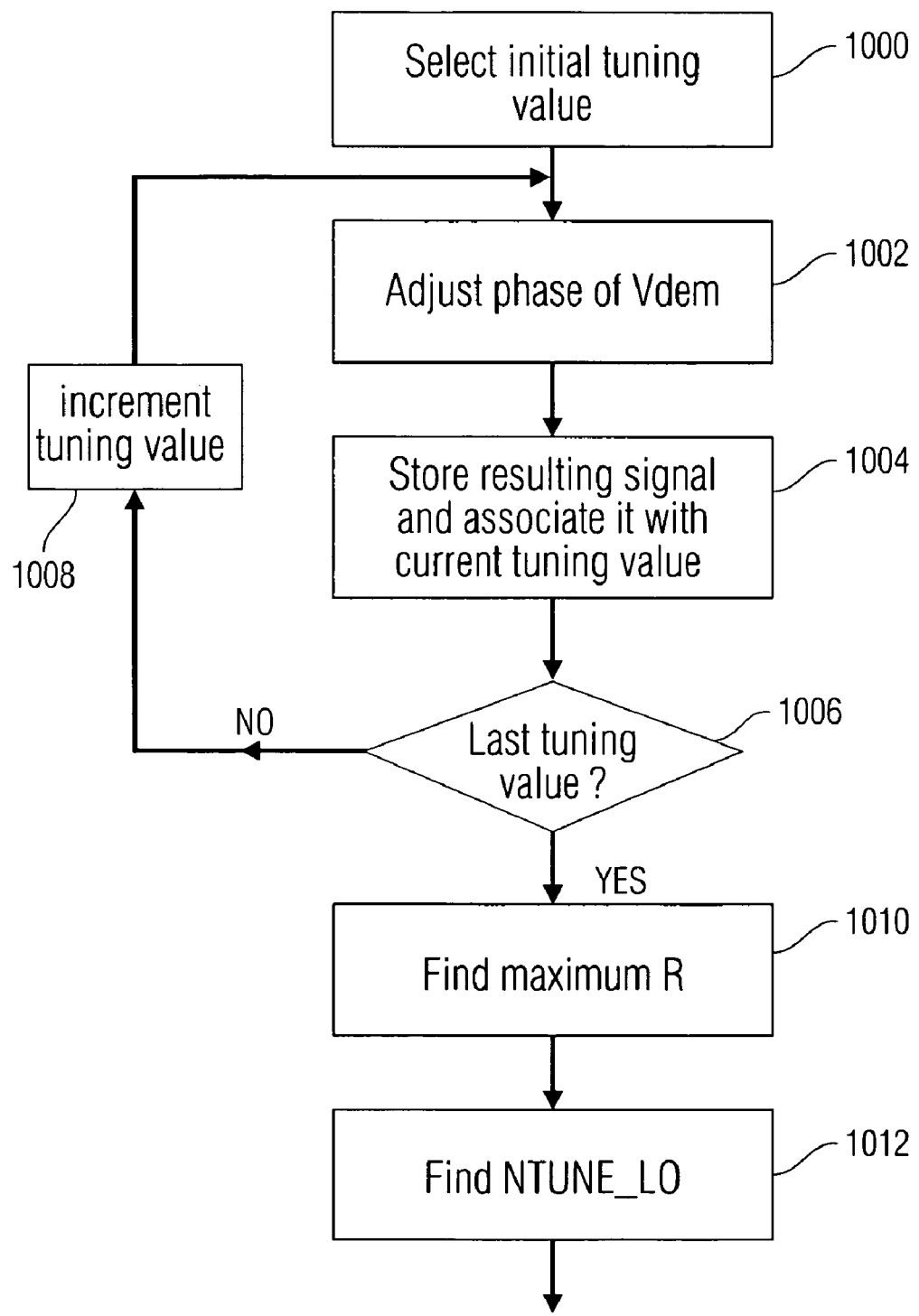
FIGS. 10A and 10B are a flow chart showing a method of scanning frequencies according to an embodiment of the invention.
Figure 10B:
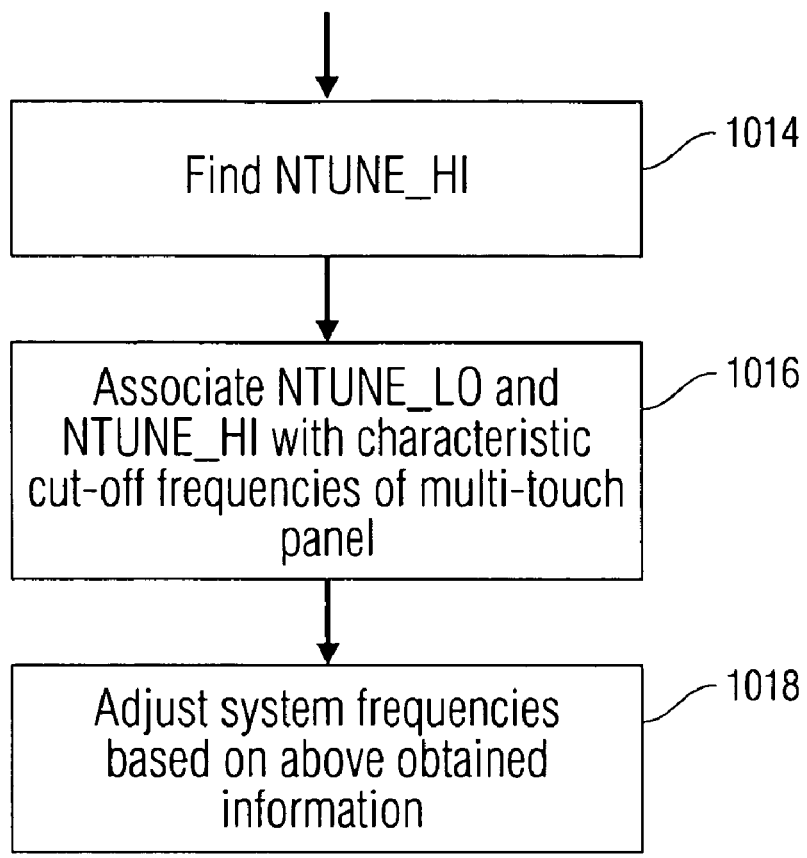

FIGS. 10A and 10B show a flow chart showing a method of scanning frequencies according to an embodiment of the invention. The method of these figures may be used to discover a range of usable frequencies as well as to obtain a formula for converting control values into resulting frequencies. The method is generally performed by controlling a tuning value. The tuning value may be control output signal 111 send to the reference current generator in order to generate a reference current. Thus, modifying the tuning value causes variation of the frequency of the oscillating signal which in turn causes variation of the frequency of the stimulation signal of the multi touch panel Vstim.

Referring to FIG. 10A, at step 1000, an initial tuning value is selected. This tuning value may the lowest available tuning value (i.e., 0). At step 1002, the phase of the demodulation signal Vdem is adjusted so that it matches the phase of signal 810 (i.e., the signal output from the amplifier circuit). See FIG. 8a for more details regarding the demodulation signal. Adjusting the phase of the demodulation signal may assist in ensuring better noise rejection at signal mixer 804 and a higher result signal 824. It can be beneficial to adjust the phase of Vdem after every modification of the tuning value, because the tuning value causes different stimulation frequencies and different stimulation frequencies can cause different phases of signal 810. This is the case because the phase of signal 810 depends on the phase of the signal coming from a column electrode of the multi touch panel which in turn depends on the delay in phase the stimulation signal experiences as it travels across the multi touch panel. The multi touch panel may be such as to cause different phase delays in the stimulation signal at different frequencies. Alternatively, even if the multi touch panel causes the same phase delay in all frequencies, the phase may still need to be adjusted because, in some embodiments, the phase can be measured and saved in units of time instead of radians; thus, keeping the phase constant in the time domain may still cause a change of phase in the radian domain if the frequency is changed.

At step 1004, the magnitude of resulting signal 824 is stored and associated with the current tuning value. Various magnitudes may be stored for example in a table. The table's index may be reflective of the tuning values associated with each stored magnitude. In an alternative embodiment, both the magnitude and its associated tuning value can be stored in the table and associated with each other. In step 1006, it is determined whether the last tuning value has been reached. If that is the case, that means that a sweep of all tuning values has been completed and the process continues on to step 1010. If the last value has not been reached the tuning value is incremented (usually by 1) in step 1008 and the process returns to step 1002.

When the process reaches step 1010, a sweep of all tuning values has been completed and resulting magnitudes of the respective result values caused by each tuning value have been saved. For example, a table can be populated wherein each value of the table R(i) signifies the magnitude of the result signal at a tuning value i. The table may include entries in the range of 0 . . . NTUNE_MAX, wherein NTUNE_MAX is the maximum possible tuning value. In the presently discussed embodiment, the values stored in the table may define a curve which is reflective of the band pass filter qualities of the multi touch panel, such as, for example the curve shown in FIG. 4.

At step 1010, the maximum value of R in the table is determined. This maximum value can be any value on plateau 407 of the curve. At step 1012, the value NTUNE_LO is determined. NTUNE_LO refers to the lowest tuning value for which the resulting value is at 3 db below (i.e., 0.7) the highest possible result value. Thus, NTUNE_LO may be discovered by scanning the table from the lowest tuning value up, until a result value which is 3 db from the highest possible result value (which was determined in the previous step) is found. The process then continues to step 1014 of FIG. 10B. At step 1014, another value—NTUNE_HI—is determined. NTUNE_HI refers to the highest value at which the resulting value is 3 dB below the highest possible resulting value. NTUNE_HI may be determined by continuing to scan the table until finding the highest tuning value at which the result is 3 dB below the maximum result value. Referring to FIG. 4, NTUNE_HI and NTUNE_LO can be associated with the boundary frequencies 408 and 409 (also referred to as the cut-off frequencies) which define the pass band of a pass band filter (the pass band filter of the present example being the multi-touch panel).

At step 1016, the tuning values NTUNE_LO and NTUNE_HI are associated with characteristic cut-off frequencies of the multi-touch panel. The characteristic cut-off frequencies can be predefined and stored at the device. They can be determined by experimentation and/or calculation. The characteristic cut off frequencies refer to frequencies which, when applied to the stimulation signal Vstim reflect the cutoff frequencies of the band pass filter formed by the multi-touch panel. These frequencies can be useful, because they can help convert a tuning value to an actual expected resulting stimulation frequency. More specifically, a frequency f as a function of a tuning value ntune can be expressed as:

$$f(ntune) = M \cdot ntune + FC\_LO, \quad \text{EQ1:}$$

wherein FC_LO is a low characteristic cut off frequency. Also, a high characteristic FC_HI may be stored by the device. Coefficient M can be derived as follows:

$$M = (FC\_LO - FC\_HI)/(NTUNE\_LO - NTUNE\_HI). \quad \text{EQ2:}$$

Since the low and the high characteristic frequencies FC_LO and FC_HI are saved and the NTUNE_LO and NTUNE_HI values can be derived using the herein discussed process, the multi touch panel processor can, when necessary, use the currently applied tuning value in conjunction with EQ1 and EQ2 to determine an actual current stimulation frequency. The multi touch panel processor may need the actual current simulation frequency for the purposes of calculating timing. For example, some protocols which the multi touch panel processor may use to communicate with other elements, such as panel processor 628, may require that responses are performed within a certain time. Similarly, protocols which the overall device may use to communicate with other devices may also have timing requirements. Yet, the rate at which the multi-touch panel processor receives data from the multi-touch panel depends on the stimulation frequency which can vary according to the herein described embodiments. Therefore, the multi-touch panel processor may use the above formulas to determine the current stimulation frequency in connection with timing requirements. The multi-touch panel can also change the tuning value, in order to change the stimulation frequency to a desired level.

It should be noted that the above calculations refer to the stimulation frequency, i.e. the frequency of signal Vstim and not necessarily to the frequency of oscillating signal 102. As discussed above, while the oscillating signal 102 is used to generate Vstim (its frequency being used as a reference for Vstim's frequency), it need not have the same frequency as Vstim. For example, the frequency of the oscillating signal may be divided to result in the frequency of Vstim. It should be further noted that, as shown in FIG. 8c, the signal Vstim may have different frequencies of different portions of the signal. However, since the relationship between the different possible frequencies of Vstim is known, the above discussed formulas can be modified and used by the multi-touch panel processor to determine the multiple stimulation frequencies of Vstim.

At step 1018, the system frequencies are adjusted based on the information obtained above. For example, the system frequencies can be adjusted so that the frequency is kept within the pass band of the multi-touch panel. This can be done simply by selecting a tuning value ntune such that: NTUNE_LO←ntune←NTUNE_HI. However, in a more advanced embodiment discussed below the tuning value may be further adjusted to avoid noise.

As the stimulation signal travels through the multi-touch panel, it may pick up unwanted noise. This can be the case due to other signals also traveling through the panel which interact with the stimulation signal by way of capacitances and inductances that may exist in the panel. Noise can be the result of a design which requires that the multi-touch panel be also used as a display screen. The display functionality may require that other signals be sent through the multi-touch panel, and these other signals can cause noise at the stimulation signal.

Figure 11:
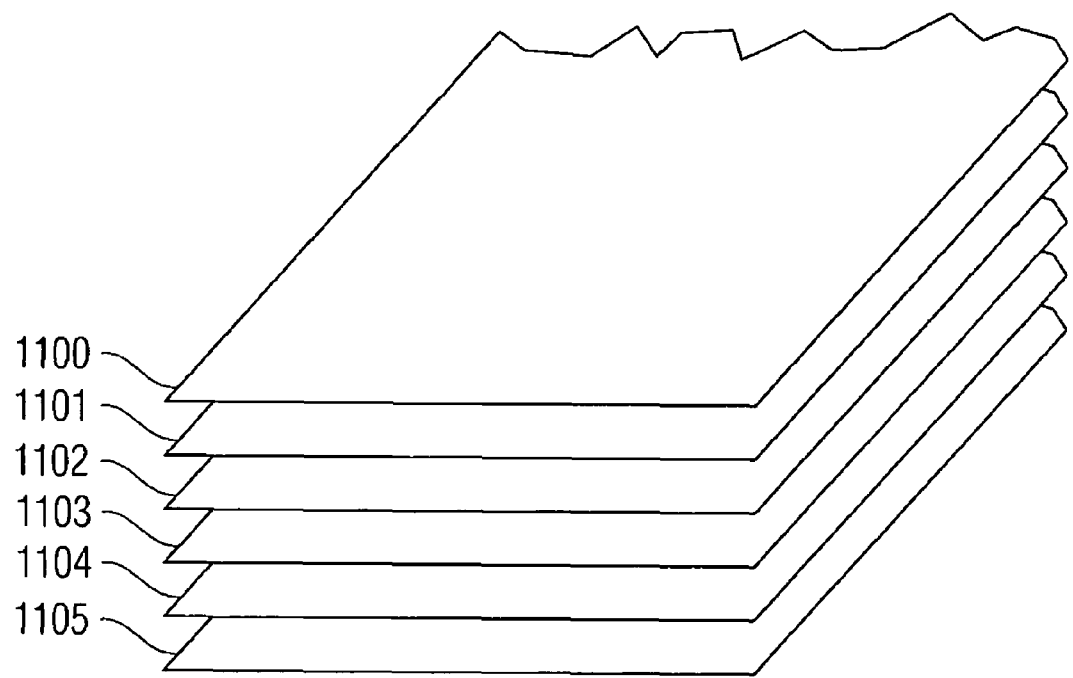
FIG. 11, is a diagram showing the layered structure of an exemplary multi-touch panel.

FIG. 11, is a diagram showing the layered structure of a multi-touch panel laminated to a Liquid Crystal Module. The multi touch panel can include various layers 1100-1105. Layers 1100, 1102 and 1104 can be dielectrics. Layer 1101 can be a layer which includes all column electrodes, while layer 1103 can include all row electrodes. Therefore, the stimulation signal Vstim can be initially applied at layer 1103 and then propagate to layer 1101 by way of the capacitances created between these layers at various row column intersections (i.e., pixels). Layer 1105 can be the solid VCOM layer of the LCM which is typically modulated with a square wave signal of certain amplitude and frequency. The VCOM frequency is typically a function of the LCM timing. However, due to the square wave nature of the VCOM modulation signal, it has major harmonics according to the Fourier series. Some of those harmonics may be in the frequency bands in which the multi-touch subsystem operates in. In one embodiment, the VCOM modulation frequency may be 14.8 KHz and generates harmonics at 44.4, 74, 103,6, 133.2, KHz. Since the layers 1103 and 1101 are made of ITO and thus have a finite resistance, the capacitance Cvr between VCOM layer 1105 and row layer 1103 form a high pass filter comprised of the capacitance Cvr and the average resistance Rrow of the row layer, thus allowing an attenuated version of the VCOM harmonics to be injected into the column layer 1101 where it may interfere with a given stimulation frequency, The magnitude of the interfering signal is a function of the high pass filter cut off frequency relative to the interfering signal. In one case, the cut off frequency of the high pass filter may be substantially higher than the harmonic (e.g. 192 Khz).

Figure 12:
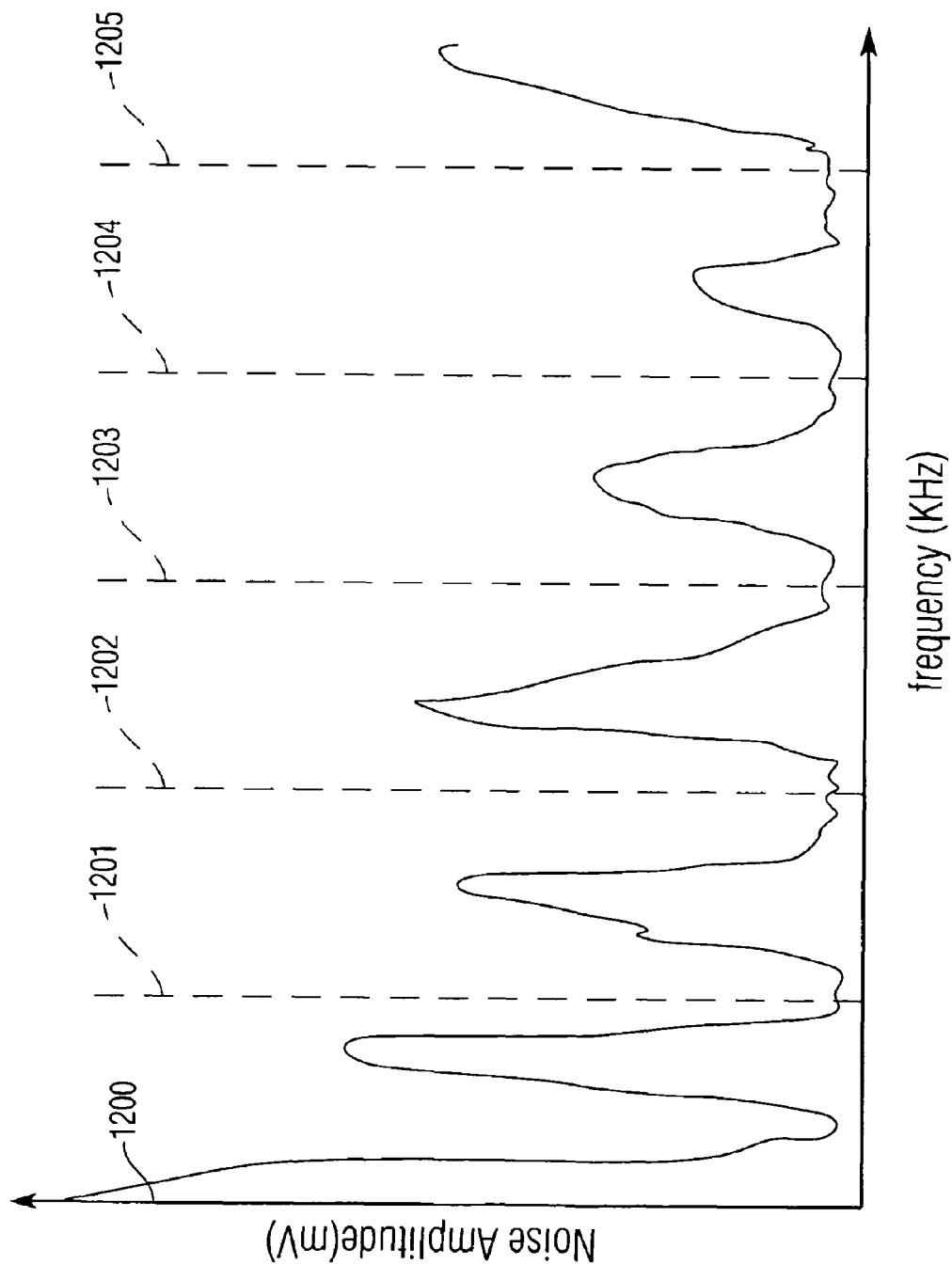
FIG. 12 is a graph showing a possible distribution of noise in the frequency spectrum according to an embodiment of the invention.

FIG. 12 is a graph showing a possible distribution of noise in the frequency spectrum according to an embodiment of the invention. The x-axis is associated with the frequency of a stimulation signal Vstim, and the y-axis is associated with the amplitude of noise that the stimulation signal experiences at that particular frequency. The noise indicated by curve 1200 can be caused by a square wave VCOM signal which is sent to a VCOM layer in proximity to one more layers through which the stimulation signal Vstim travels (as shown in FIG. 11 and discussed above). A square wave can be represented as a sum of a plurality of sine waves of different frequencies. Therefore, that square wave, even if applied at a single frequency, can cause noise at multiple frequencies associated with its component sine waves, or harmonics. However, as seen in FIG. 12, even if noise is present at multiple frequencies there may still be certain relatively noise free frequencies. Ranges of such low noise frequency can be referred to as low noise channels. In the example of FIG. 12, some of the low noise channels are noted with lines 1201-1205. The low noise channels include frequencies at these lines as well as a range of adjacent frequencies.

As discussed above, in the context of FIGS. 10A and 10B, an embodiment of the invention may be configured to control the stimulation frequency so that it is within a pass band of a band pass filter formed by the multi-touch panel. Another embodiment may provide for control of the stimulation frequency in order to place it within a low noise channel and thus reduce noise in the stimulation signal. Yet another embodiment may combine these two features and provide a frequency control scheme that keeps the frequency within the pass band and also ensures that the frequency stays in low noise channels within the pass band. In other words, one embodiment may use the method shown in FIG. 12 as well as the method shown in FIG. 13 and discussed below.

Figure 13:
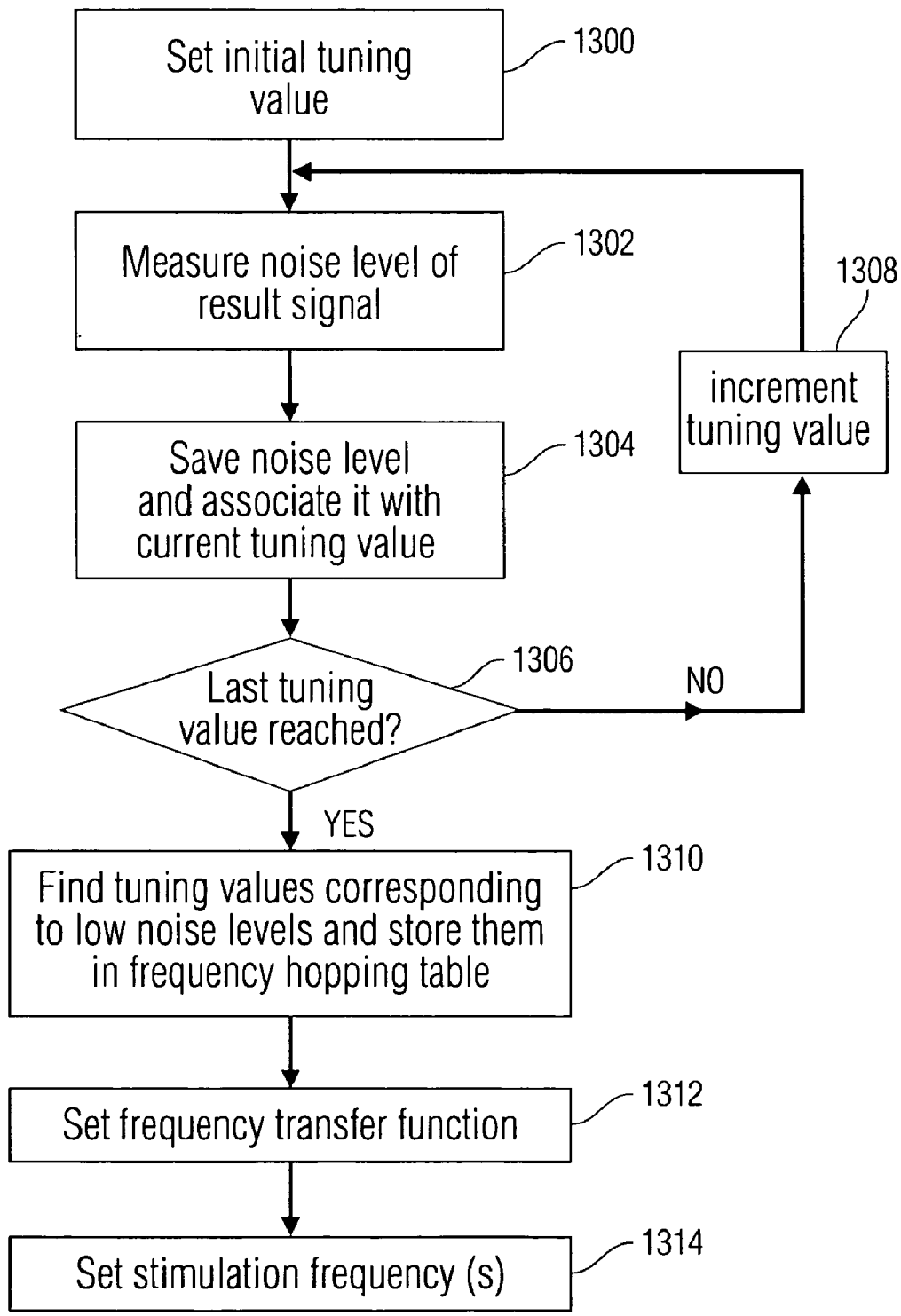
FIG. 13 is a flow chart showing a method for controlling the stimulation frequency in order to avoid noise.

FIG. 13 is a flow chart showing a method for controlling the stimulation frequency in order to avoid noise. At step 1300 an initial tuning value is set. The initial tuning value can be zero. However, in an embodiment which uses the present method in combination with the method of FIGS. 10A and B, the initial tuning value can be set at NTUNE_LO. Thus, only frequencies within the pass band (which can be determined by the method of FIGS. 10A, B) may be scanned. In one embodiment, a step of calibration of the phase of the demodulation signal (e.g., a step similar to step 1002 of FIG. 10A) can be performed after step 1300.

At step 1302, the noise level of the result signal is measured. The noise level may be measured by repeatedly sampling the result signal within a relatively short period of time and noting differences in the magnitude of the result signal. Since the method of FIG. 13, is generally considered a method for performing set up or initialization it may be performed in a controlled environment where it is known that the user is not touching the screen. Since the user is not touching the screen the value of the result signal should stay constant for each channel. Thus, if there are temporal differences in the result signal, they can be usually attributed to noise. In another embodiment, the process of FIG. 13 can be performed during normal operation (i.e., without taking steps to ensure that the panel not be touched). In this embodiment, noise can still be measured, by filtering out variations of the result signal which are of nature which is known to be due to a touch event and not due to noise. For example, variations of the result signal that are over a certain threshold can be considered to be the result of a touch event and can be ignored. A noise level value can be derived based on the fluctuations of the result signal. For example, the noise level value can be set to the maximum fluctuation between any two sampled values, the mean fluctuation between all combinations of sampled values, etc.

At step 1304, the noise level is saved and associated with the current tuning value. The noise level is preferably saved in a noise look up table. The association with the tuning value may be based on the index of the table (as discussed above in connection with FIG. 10A). Alternatively, the tuning value may also be saved and associated with its corresponding noise level value in the table. At step 1306, it is determined whether the last tuning value has been reached. Again, the last tuning value can be the last possible tuning value, or, in an alternative embodiment, the last tuning value within the pass band (i.e., NTUNE_HI). If the last tuning value has not been reached, the tuning value is incremented in step 1308. If it has been reached, the process continues onto step 1308.

At step 1308, the tuning values which correspond to low noise levels can be determined. Low noise levels can be defined as a noise level lower than a predefined threshold value. Alternatively, low noise levels can be defined in a statistical manner, e.g. the lowest 10% of measured noise levels can be considered to be low noise levels. The tuning values associated with low noise levels can be stored in a frequency hopping table, The frequency hopping table can be distinct from the noise look up table. While the noise look up table can include the noise levels and corresponding tuning values of all scanned tuning values, the frequency hopping table may include only tuning values which correspond to low noise levels. In other words, the frequency hopping table can define the low noise channels discussed above. The frequency hopping table can then be used by the device (e.g., by the multi-touch panel processor) to choose one or more stimulating frequencies for the stimulating signal Vstim.

Step 1310 is optional and it is similar to step 1016 of FIG. 10B. It is used to correlate tuning values to actual resulting frequencies. If the types of expected interference are known (e.g., if the expected VCOM signal discussed in connection with FIG. 11 is known), then the frequencies at which the low noise channels are expected to appear can also be calculated. Therefore, one or more expected low noise frequencies can be calculated and saved in the device. Once the low noise tuning values are found, they can be correlated with the saved low noise frequencies in order to obtain a formula similar to EQ. 1 and EQ. 2 for calculating the frequency which corresponds to a particular tuning value. At step 1312, one or more stimulation frequencies of the signal Vstim are set. The frequencies are set by selecting a tuning value from the frequency hopping table and sending that tuning value to the reference current generator. If more than one frequencies are used, then multiple tuning values from the frequency hopping table can be periodically sent to the reference current generator.

Figure 14:
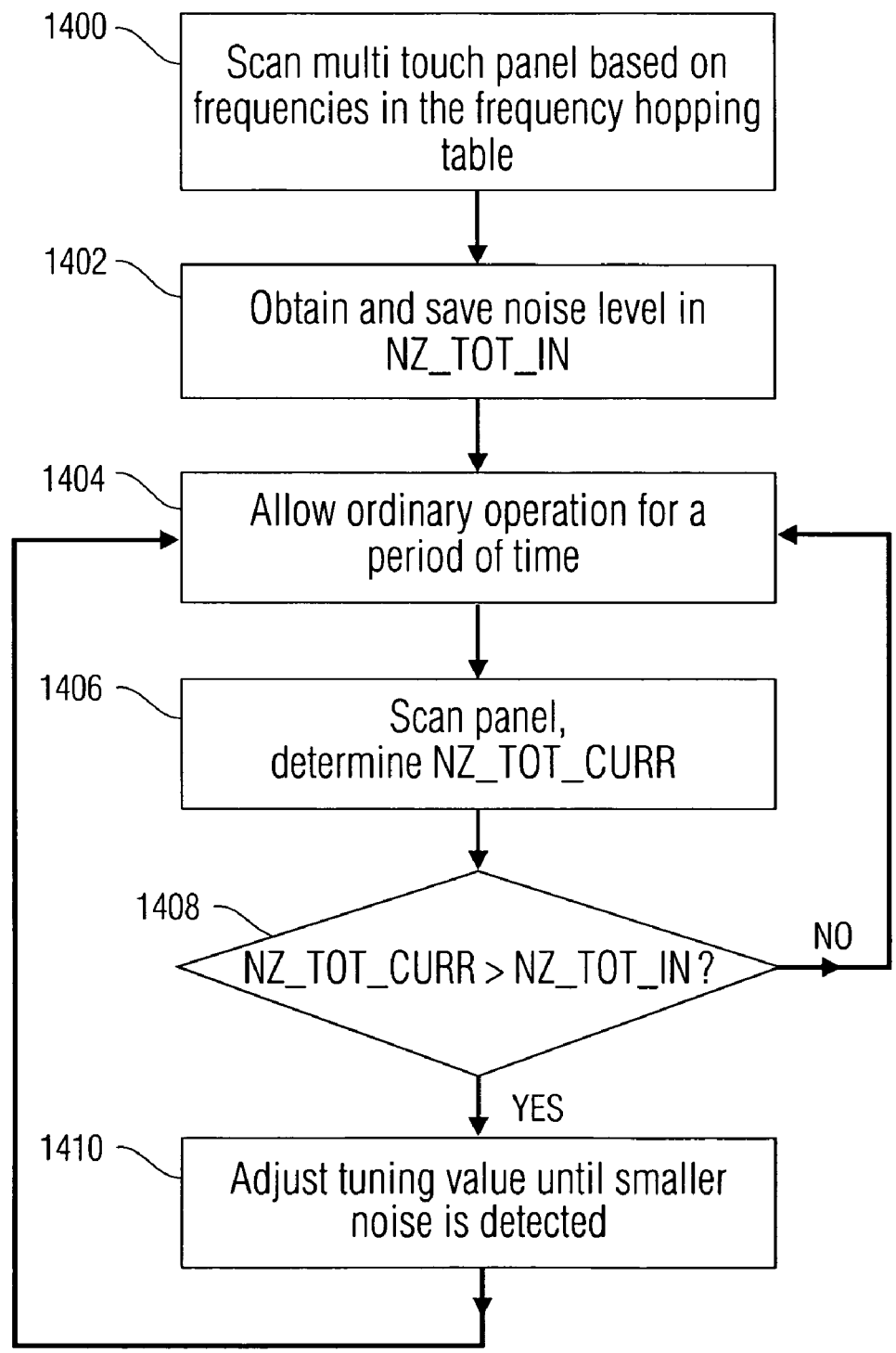
FIG. 14 is a flow chart showing a method for correcting for drift.

Thus, the frequency of the stimulation signal may be set to a desirable value. However, the frequency may drift over time. That is, even if the tuning value does not change, the frequency of the oscillating signal may change over time and this may cause respective changes of the frequency of the stimulation signal. Drift is possible because the various electronic elements that comprise oscillating circuit 100 and reference current generator 110 may experience variations in their operating properties. For example, the band gap of the reference current generator can change its output value thus causing a change of the reference current and consequently a change of the frequency of the oscillating signal without a corresponding change in the tuning signal. Therefore, an embodiment of the present invention provides for periodic scanning to determine if the frequency generation circuits are drifting, and if they are, to correct for the drift. Accordingly, FIG. 14 is a flow chart showing a method for correcting for drift.

Step 1400 can be performed shortly after the set up operation discussed in relation with FIG. 13 is completed. Accordingly, step 1400 and the following step 1402 may be considered to be part of the initialization of the device. At step 1400, the multi touch panel can be scanned while one or more tuning values of the frequency hopping table are used to generate the stimulation frequency. This scan may be used to determine the initial overall level of noise achieved right after initialization. This level of noise may be relatively low, as the initialization of FIG. 13 is specifically designed to decrease noise. At step 1402, an overall initial level of noise is saved in variable NZ_TOT_IN. The noise at each channel can be determined by monitoring the result value at that channel within a period of time and deriving a noise attribute based on the differences that appear at the result value over that period. The overall noise value NZ_TOT_IN can be determined, by summing the noise variables derived for all channels.

At step 1404, the device can proceed to ordinary operation for a period of time. This step may be used because the drift correcting algorithm of the following steps need not be executed at all times, but may be executed periodically as any noticeable frequency drift is only likely to occur after the passage of time. After a period of time, an automatic retuning algorithm can be triggered by proceeding to step 1406. At step 1406, the multi touch panel processor can scan the multi-touch panel and determine a current total noise level NZ_TOT_CURR. The scan of the panel may be an ordinary scan performed during ordinary operation of the device. Thus, the result values produced by such an ordinary operation scan and usually used to determine if there are any touch events at the multi-touch panel can also be used to determine the current total noise level.

However, it should be noted that the usual way of determining the total noise level (i.e., calculating temporal differences of the result signal of a particular channel) may not be always reliable at this time. This is the case, because at this time changes in the result signal can be caused not only by noise but by touch events on the panel. As step 1406 is usually performed during normal operation of the device, a user may touch the multi-touch panel during that step. In contrast, the methods of FIGS. 10A and B, and 13, as well as steps 1400 and 1402 can be performed at time of initialization of the device, when some steps may optionally be taken to ensure that the multi-touch panel is not touched. Therefore, at step 1406, additional actions may be taken to distinguish touch events from noise and remove the differences in the various result signals caused by touch events from the noise calculations. This may be done by using algorithms which distinguish touch events from noise. These algorithms may be based on differences in the expected changes of the result signal based on touch events and on noise. For example, in one embodiment, it can be expected that touch events cause sudden and large decreases of the results signal. Therefore, such changes of the various result signals can be ignored for the calculation of the total current noise.

At step 1408 it is determined whether the total current noise is larger than the total initial noise. If that is not the case, then no detrimental drift is happening. Thus, operation proceeds to step 1404 in which the algorithm waits a period of time until another test for drift is to be performed. If the total current noise is larger than the total initial noise, then some detrimental drift may have occurred. Therefore, at step 1410, the tuning value is adjusted until the detected noise is at a desirable level (i.e., lower than NZ_TOT_IN). The adjustments may be made within predefined parameters, which are based on the expected drift range of the oscillator circuit (which in turn also depends on the expected drift range of the reference current generator). The expected drift range may be calculated based on known or experimentally derived parameters of the various electronic elements of these circuits. Subsequently, values related to these expected drift ranges can be saved in the device and used in step 1410. Thus, when step 1410 is reached, the multi-touch panel processor can vary the tuning value within a certain range of the current tuning value, and that range can be based on the expected drift range. While thus varying the tuning value, the multi-channel processor can calculate the noise levels of each tuning value to determine a new tuning value resulting in a desirably small noise level. After such new tuning value is detected, the multi-channel panel processor can keep the oscillating circuit at the new tuning value and proceed to step 1404.

In one embodiment, ordinary operation of the device may proceed during step 1410. In other words, while the multi-channel processor is changing the tuning value, the device may continue ordinary operation and detect touch events for each new tuning value. Software running at the processor may allow it to switch between functions related to ordinary touch event sensing function and step 1410 so that these two actions are effectively performed concurrently. Since the range of tuning values which is scanned during 1410 may be limited by the drift range of the oscillating circuit and consequently be relatively small, then the act of changing tuning values during a scan could result in a relatively minor deviation from the ordinary operation of the device.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:
1. An electronic device comprising:
an oscillator module configured to generate an oscillating signal of a frequency based on a tuning value input at a tuning input of the oscillator module;
a result signal generator configured to provide a result signal which is at least partially based on the oscillating signal; and
a controller connected to the tuning input of the oscillator module and the result signal generator and configured to apply a plurality of different tuning values to the tuning input of the oscillator module, for each applied tuning value, obtain and save repeated samples of the result signal during a time period at which the tuning value is applied, determine a respective noise value derived from the saved samples, the noise value computed from those saved samples that are at or below a certain threshold, while excluding from the determination of the noise value any saved samples obtained during that time period that exceed the threshold and are considered to be caused by a touch event, the noise value being indicative of a level of noise which appears at the result signal while the applied tuning value is being applied, and perform touch detection using the saved samples regardless of the noise value determination, select one or more low noise tuning values of the plurality of different tuning values, the low noise tuning values being associated with low respective noise values, and apply a low noise tuning value of the one or more low noise tuning values to the tuning input of the oscillating circuit.

2. The electronic device of claim 1, wherein the oscillator module is free of any crystal oscillators and does not rely on any crystal oscillators to generate the oscillating signal.

3. The electronic device of claim 2, wherein the controller is further configured to enter a frequency initialization mode, wherein the applying a plurality of different tuning values, determining a respective noise value, selecting one or more low noise values and applying one of the one or more noise values are performed during the frequency initialization mode, and the controller is further configured to enter an ordinary operation mode and proceed with ordinary operation while continuing to apply the low noise tuning value to the tuning input of the oscillating circuit.

4. The electronic device of claim 1, wherein the controller is a generally programmable processor.

5. The electronic device of claim 1,
wherein the device further comprises a multi-touch panel configured to receive a stimulation signal whose frequency is based on the oscillating signal, and to output a panel output signal based on the stimulation signal, wherein the result signal generated by the result signal generator is based on the panel output signal.

6. The electronic device of claim 5, wherein noise in the result signal is at least partially caused by noise in the panel output signal and the noise in the panel output signal is at least partially caused by interactions of the stimulation signal with other signals at the multi-touch panel.

7. The electronic device of claim 5, wherein the multi touch panel also features display functionality and includes two or more layers comprising:
one or more touch sensitive layers, configured to perform multi-touch functionality, receive the stimulation signal and output the panel output signal; and
one or more display related layers configured to perform display functionality, and receive a display related signal,
wherein the display related signal at least partially causes the noise of the panel output signal.

8. The electronic device of claim 7, wherein the display related signal is the sum of a plurality of component signals each having a different component frequency, said component signals causing noise of a plurality of different component frequencies in the panel output signal.

9. The electronic device of claim 8, wherein each tuning value of the plurality of tuning values is associated with a respective resulting frequency in the panel output signal, and the one or more low noise tuning values are associated with resulting frequencies different than the component frequencies.

10. The electronic device of claim 8, wherein the display related signal is a square wave signal.

11. The electronic device of claim 5, wherein the one or more low noise tuning values are two or more low noise tuning values and the controller is further configured to apply two or more of the two or more low noise tuning values in periodic succession.

12. The electronic device of claim 5, wherein the controller is further configured to retrieve one or more previously defined expected low noise stimulation frequencies, and correlate the expected low noise stimulation frequencies and the low noise tuning values to derive a relationship between various tuning values and the stimulation frequencies that result from said various tuning values.

13. The electronic device of claim 5, wherein the multi-touch panel further includes a band pass filter and the controller is configured to only select low noise tuning values which result in stimulation frequencies which are within the pass band of the band pass filter.

14. The electronic device of claim 5, wherein the multi-touch panel is also a proximity sensing panel.

15. The electronic device of claim 1, wherein the low noise tuning values are associated with the lowest noise values.

16. The electronic device of claim 1, wherein the electronic device is a digital audio player.

17. The electronic device of claim 1, wherein the electronic device is a mobile telephone.

18. The electronic device of claim 1, wherein the electronic device further comprises a memory connected to the controller and the controller is further configured to save the low noise tuning values in a frequency hopping table in the memory.

19. A method for generating an oscillating signal in an electronic device the method comprising:
applying a plurality of different tuning values to an oscillator module;
generating, by the oscillator module, an oscillating signal whose frequency is based on a currently applied tuning value;
providing a result signal at least partially based on the oscillating signal;
for each applied tuning value, obtaining and saving repeated samples of the result signal during a time period at which the tuning value is applied, determining a respective noise value derived from the saved samples, the noise value computed from those saved samples that are at or below a certain threshold, while excluding from the determination of the noise value any saved samples obtained during that time period that exceed the threshold and are considered to be caused by a touch event, the noise value being indicative of a level of noise which appears at the result signal while the applied tuning value is being applied, and performing touch detection using the saved samples regardless of the noise value determination;
selecting one or more low noise tuning values of the plurality of different tuning values, the low noise tuning values being associated with low respective noise values; and
applying a low noise tuning value of the one or more low noise tuning values to the tuning input of the oscillating circuit.

20. The method of claim 19, wherein generating of the oscillating signal is performed without use of crystal oscillators or any signals depending from crystal oscillators.

21. The method of claim 19, wherein the determining of a respective noise value is performed by a controller and the controller is a generally programmable processor.

22. The method of claim 19, further comprising:
generating a stimulation signal whose frequency is based on the oscillating signal;
sending the stimulation signal to a multi-touch panel; and
producing a panel output signal by the multi-touch panel, the panel output signal being based on the stimulation signal,
wherein the result signal is based on the panel output signal.

23. The method of claim 22, wherein noise in the result signal is at least partially caused by noise in the panel output signal and the noise in the panel output signal is at least partially caused by interactions of the stimulation signal with other signals at the multi-touch panel.

24. The method of claim 22, wherein the multi touch panel also features display functionality and the method further comprising sending a display related signal to the multi touch panel, wherein the display related signal interacts with the stimulation signal to at least partially cause the noise of the panel output signal.

25. The method of claim 24, wherein the display related signal is the sum of a plurality of component signals of plurality of different component frequencies, said component signals causing noise of the plurality of different component frequencies in the panel output signal.

26. The method of claim 25, wherein each tuning value of the plurality of tuning values is associated with a respective resulting frequency in the panel output signal, and the one or more low noise tuning values are associated with resulting frequencies different than the component frequencies.

27. The method of claim 25, wherein the display related signal is a square wave signal.

28. The method of claim 22, wherein the one or more low noise tuning values are two or more low noise tuning values and the method further comprises applying two or more of the two or more low noise tuning values in periodic succession to produce a stimulation signal having a periodically changing frequency.

29. The method of claim 22, wherein the controller is further configured to retrieve one or more previously defined expected low noise stimulation frequencies, and use the expected low noise stimulation frequencies and the low noise tuning values to derive a relationship between various tuning values and the stimulation frequencies that result from said various tuning values.

30. The method of claim 22, wherein the multi-touch panel further includes a band-pass filter and the applying a low noise tuning value comprises applying a low noise tuning value which results in a stimulation frequency which is within the pass band of the band pass filter.

31. The method of claim 22, wherein the multi-touch panel is also a proximity sensing panel.

32. The method of claim 19, wherein the low noise tuning values are associated with the lowest noise values.

33. The method of claim 19, further including saving the low noise tuning values in a frequency hopping table.

34. A digital audio player comprising:
an oscillator module configured to generate an oscillating signal of a frequency based on a tuning value input at a tuning input of the oscillator module;
a result signal generator configured to provide a result signal which is at least partially based on the oscillating signal; and
a controller connected to the tuning input of the oscillator module and the result signal generator and configured to
apply a plurality of different tuning values to the tuning input of the oscillator module,
for each applied tuning value, obtain and save repeated samples of the result signal during a time period at which the tuning value is applied, determine a respective noise value derived from the saved samples, the noise value computed from those saved samples that are at or below a certain threshold, while excluding from the determination of the noise value any saved samples obtained during that time period that exceed the threshold and are considered to be caused by a touch event, the noise value being indicative of a level of noise which appears at the result signal while the applied tuning value is being applied, and perform touch detection using the saved samples regardless of the noise value determination,
select one or more low noise tuning values of the plurality of different tuning values, the low noise tuning values being associated with low respective noise values, and
apply a low noise tuning value of the one or more low noise tuning values to the tuning input of the oscillating circuit.

35. A mobile telephone comprising:
an oscillator module configured to generate an oscillating signal of a frequency based on a tuning value input at a tuning input of the oscillator module;
a result signal generator configured to provide a result signal which is at least partially based on the oscillating signal; and
a controller connected to the tuning input of the oscillator module and the result signal generator and configured to
apply a plurality of different tuning values to the tuning input of the oscillator module,
for each applied tuning value, obtain and save repeated samples of the result signal during a time period at which the tuning value is applied, determine a respective noise value derived from the saved samples, the noise value computed from those saved samples that are at or below a certain threshold, while excluding from the determination of the noise value any saved samples obtained during that time period that exceed the threshold and are considered to be caused by a touch event, the noise value being indicative of a level of noise which appears at the result signal while the applied tuning value is being applied, and perform touch detection using the saved samples regardless of the noise value determination,
select one or more low noise tuning values of the plurality of different tuning values, the low noise tuning values being associated with low respective noise values, and
apply a low noise tuning value of the one or more low noise tuning values to the tuning input of the oscillating circuit.

36. An electronic device including a first module and a second module, the first module including a first clock generator for generating a first clock signal for the first module, the second module including a second clock generator for generating a second clock signal for the second module, the first clock generator including a crystal oscillator on which the frequency of the first clock signal is based, the second clock generator being free of any crystal oscillators, wherein:

the first module is configured to generate a first output signal at frequency based on the frequency of the first clock signal; and the second module is configured to generate a second output signal at frequency based on the second clock signal, send the second output signal through a traversal circuit obtain and save repeated samples of an output of the traversal circuit during a time period at which the second output signal is applied, sense any noise that has appeared on the output of the traversal circuit as a result of sending the second output signal through the traversal circuit, said noise being at least partially dependent on the first output signal, the sensed noise computed from those saved samples that are at or below a certain threshold, while excluding from the sensed noise any saved samples obtained during that time period that exceed the threshold and are considered to be caused by a touch event, perform touch detection using the saved samples regardless of the sensed noise, and control the frequency of the second clock signal based on the sensed noise.

37. The electronic device of claim 36, wherein the second module is further configured to:

vary the frequency of the second clock signal to cause variations of the frequency of the second output signal;

detect the level of noise appearing at each frequency of the second output signal; and control the frequency of the second clock signal by using frequencies associated with one or more detected levels of noise as reference points.

38. The electronic device of claim 37, wherein controlling the frequency of the second clock signal is accomplished by sending a tuning value to the second clock generator, the device further including a frequency transfer function generation module for generating a frequency transfer function based on the detected levels of noise, their associated tuning values, and one or more predefined expected frequency values at which predefined levels of noise are expected to appear.

39. The electronic device of claim 38, wherein the electronic device includes a multi-touch display panel configured to provide display functionality and to sense multiple touches from a user, the first module is a display module configured to provide the display functionality and the second module is a touch sensitive panel module configured to provide touch sensing functionality.

40. The electronic device of claim 1, wherein the traversal circuit is a multi-touch panel.

41. The method of claim 19, wherein the traversal circuit is a multi-touch panel.

42. The electronic device of claim 36, wherein the traversal circuit is a multi-touch panel.

43. A touch sensitive device comprising:
a touch sensor panel; and
a touch subsystem communicatively coupled to the touch sensor panel and configured for applying a series of stimulation signals of different frequencies to one or more drive lines of the touch sensor panel, receiving one or more sense signals from the touch sensor panel resulting from each of the stimulation signals of different frequencies, obtaining and saving repeated samples of the one or more sense signals during a time period at which stimulation signals of a particular frequency are applied, determining a noise value from the saved samples for each of the stimulation signals of different frequencies, the noise value computed from those saved samples that are at or below a certain threshold, while excluding from the determination of the noise value any saved samples obtained during that time period that exceed the threshold and are considered to be caused by a touch event, performing touch detection using the saved samples regardless of the noise value determination, selecting one or more low noise stimulation signals corresponding to one or more low noise frequencies as determined by the noise values, and applying a low noise stimulation signal to the touch sensor panel.

44. The touch sensitive device of claim 43, the touch subsystem further configured for applying the series of stimulation signals of different frequencies in a frequency initialization mode, and applying the low noise stimulation signal in an ordinary operation mode.

45. The touch sensitive device of claim 43, the touch subsystem further configured for:

determining the noise values for the low noise stimulation signals for a previous and current time; and if a difference between the noise values for the previous and current time exceed a predetermined threshold indicative of drift, adjusting the selected low noise stimulation signals until their noise values improve to a predetermined acceptable level.

46. A method of operating a touch sensor panel, comprising:

stimulating the touch sensor panel with a series of stimulation signals of different frequencies;

obtaining and saving repeated samples of one or more sense signals obtained from the touch sensor panel during a time period at which stimulation signals of a particular frequency are applied;

determining a noise value from the saved samples for each of the stimulation signals of different frequencies, the noise value computed from those saved samples that are at or below a certain threshold, while excluding from the determination of the noise value any saved samples obtained during that time period that exceed the threshold and are considered to be caused by a touch event;

performing touch detection using the saved samples regardless of the noise value determination; and applying a low noise stimulation signal to the touch sensor panel as determined by the noise values.

47. The method of claim 46, further comprising determining the noise values in a frequency initialization mode, and applying the low noise stimulation signal in an ordinary operation mode.

48. The method of claim 46, further comprising:

detecting frequency drift in the low noise stimulation signal; and if the frequency drift exceeds a predetermined threshold, adjusting the selected low noise stimulation signal until its noise value improves to a predetermined acceptable level.

* * * * *